(12) United States Patent
Bucklew et al.

(10) Patent No.: US 12,724,052 B2
(45) Date of Patent: Sep. 1, 2026

(54) RYDBERG SENSOR HAVING AN ARRAY OF QUANTUM RADIO FREQUENCY (QRF) CAVITIES AND ASSOCIATED METHODS

(71) Applicant: Eagle Technology, LLC, Melbourne, FL (US)

(72) Inventors: Victor G. Bucklew, Richmond, VA (US); James A. Drakes, Occoquan, VA (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 160 days.

(21) Appl. No.: 18/882,824

(22) Filed: Sep. 12, 2024

(65) Prior Publication Data

US 2026/0072066 A1 Mar. 12, 2026

(51) Int. Cl.
*G01R 29/08* (2006.01)

(52) U.S. Cl.
CPC ................................ *G01R 29/0885* (2013.01)

(58) Field of Classification Search
None
See application file for complete search history.

(56) References Cited

U.S. PATENT DOCUMENTS 11,598,798 B1 * 3/2023 Bucklew ............ G01R 29/0885
11,815,538 B2 11/2023 Bucklew et al.
12,235,304 B2 * 2/2025 Verploegh .......... G01R 29/0885
2022/0276293 A1 9/2022 Compton et al.
2022/0334162 A1 * 10/2022 Cox .................. G01R 29/0885
2023/0221406 A1 * 7/2023 Bucklew ............ G01R 29/0878 342/175
2024/0210457 A1 6/2024 Himsworth
2026/0009833 A1 * 1/2026 Bucklew ............ G01R 29/0885

OTHER PUBLICATIONS

Borowka et al., "Continuous Wideband Microwave-to-Optical Converter Based on Room-Temperature Rydberg Atoms," Nature Photonics; vol. 18, Issue 1; Oct. 5, 2023; pp. 32-38.
Cai et al., "Sensitivity Improvement and Determination of Rydberg Atom-Based Microwave Sensor," Photonics; 2022; 9, 250; Apr. 10, 2022; pp. 1-14.
Degen et al., "Quantum Sensing," Reviews of Modern Physics; vol. 89; No. 3; Jul.-Sep. 2017; pp. 1-39.
Fan et al., "Atom Based RF Electric Field Sensing," Journal of Physics B: Atomic, Molecular and Optical Physics; 48; 202001; 2015; pp. 1-16.
Fancher et al., "Rydberg Atom Electric Field Sensors for Communications and Sensing," IEEE Transactions on Quantum Engineering; Quantum Sensing and Metrology; vol. 2; 3501313; published Mar. 10, 2021; pp. 1-13.

(Continued)

*Primary Examiner* — Richard Isla
(74) *Attorney, Agent, or Firm* — ALLEN, DYER, DOPPELT, GILCHRIST, P.A. Attorneys at Law

(57) ABSTRACT

A Rydberg sensor may include an array of Rydberg quantum radio frequency (QRF) cavities arranged in rows and columns. A probe laser source may be configured to generate a time delayed probe beams for respective ones of the rows of Rydberg QRF cavities. An RF signal source may be configured to generate time delayed RF signals for respective ones of the columns of Rydberg QRF cavities.

22 Claims, 21 Drawing Sheets

(56) References Cited

OTHER PUBLICATIONS

Gordon et al., "Weak Electric-Field Detection with Sub-1 Hz Resolution at Radio Frequencies Using a Rydberg Atom-Based Mixer," AIP Advances; vol. 9, Issue 4; Apr. 25, 2019; pp. 1-5.
Holloway et al., "Rydberg Atom-Based Field Sensing Enhancement Using a Split-Ring Resonator," Applied Physics Letter; 120, 204001; May 20, 2022; pp. 1-6.
Knarr et al., "Spatiotemporal Multiplexed Rydberg Receiver," IEEE Transactions on Quantum Engineering; Quantum Sensing and Metrology; vol. 4; 3500108; Sep. 29, 2023; pp. 1-8.
Meyer et al., "Assessment of Rydberg Atoms for Wideband Electric Field Sensing," Journal of Physics B: Atomic, Molecular and Optical Physics; vol. 53, No. 3; Jan. 10, 2020; pp. 1-17.
Prajapati et al., "Enhancement of Electromagnetically Induced Transparency Base Rydberg-Atom Electrometry Through Population Repumping," Applied Physics Letters; vol. 119, Issue 21; Nov. 22, 2021; pp. 1-5.
Yao et al., "Sensitivity Enhancement of Far-Detuned RF Field Sensing Based on Rydberg Atoms Dressed by a Near-Resonant RF Field," Optics Letters; vol. 47, No. 20; Oct. 2022; pp. 5256-5259.
U.S. Appl. No. 18/439,791, filed Feb. 13, 2024 Inventors: Bucklew et al.
U.S. Appl. No. 18/415,719, filed Jan. 18, 2024 Inventors: Bucklew et al.
U.S. Appl. No. 18/762,724, filed Jul. 3, 2024 Inventors: Bucklew et al.
U.S. Appl. No. 18/762,734, filed Jul. 3, 2024 Inventors: Bucklew et al.
U.S. Appl. No. 18/801,887, filed Aug. 13, 2024 Inventors: Bucklew et al.
U.S. Appl. No. 18/809,398, filed Aug. 20, 2024 Inventors: Knarr et al.
Yuan et al. "Quantum sensing of microwave electric fields based on Rydberg Atoms", Reports on Progress in Physics, Institute of Physics, vol. 86, No. 10, Sep. 2023, pp. 1-16.

* cited by examiner

RYDBERG SENSOR HAVING AN ARRAY OF QUANTUM RADIO FREQUENCY (QRF) CAVITIES AND ASSOCIATED METHODS

FIELD OF THE INVENTION

The present invention relates to Rydberg sensors, and more particularly, to a Rydberg sensor having Rydberg quantum radio frequency (QRF) cavities and related methods.

BACKGROUND OF THE INVENTION

Radio frequency (RF) signals are generated and received in communications and sensing applications across a wide range of commercial markets and government divisions. Emerging RF applications are pushing technical requirements to higher frequency ranges with new waveforms that may be difficult to detect and that may need RF receivers or sensors having increased sensitivity. As conventional RF channels become more heavily crowded, there is a desire to use alternative RF bands spanning from tens of KHz to 300 MHz and beyond. While some RF receivers and sensors span multiple RF bands, most are band-limited and can cover only a few tens of GHz, with a typical upper limit of about 40 GHz, e.g., the Ka band. Also, some state-of-the-art RF receivers and sensors are not compatible with new waveforms used in emerging distributed sensing networks and new RF applications that are sensitivity limited, or not served with existing narrow band antenna-based RF receivers and sensors.

Conventional RF devices that incorporate RF antennas may have a high technology readiness level (TRL) and are used in almost every modern RF sensing or communications system. There are limitations with RF antennas, however, because they are Size, Weight and Power (SWaP) limited. The antenna is also on the order of the RF wavelength of radiation, and the RF coverage is over a relatively narrow frequency band, such as 1-10 GHZ or 20-40 GHz. Many conventional RF devices employ antenna designs that are not compatible with emerging waveforms and may lack sensitivity, making them difficult to cover wide bandwidths with high sensitivity.

To address these limitations, Rydberg atom-based RF sensors have been developed, which convert the response of an atomic vapor to incoming RF radiation into measurable changes in an optical probe. These RF sensors provide a new model for RF sensing with increased sensitivity. For example, conventional antennas may provide at most about −130 to −160 dBi/Hz (decibel intensity), but with a Rydberg system, it can be up to about-200 dBi/Hz with a broader range coverage in a single receiver from KHz to THz.

In a Rydberg atom-based RF sensor, the measurement is based upon the attenuation of a probe laser due to absorption in a small room temperature vapor cell filled with alkali atoms, such as rubidium (Rb) or cesium (Cs). In a 2-photon/laser Rydberg sensing system, atoms are simultaneously excited into a "Rydberg" state with both a coupling laser and probe laser. These Rydberg states are very responsive to local electric fields and the response of the atom to an external electric field, such as an RF signal, alters the measured attenuation of the probe laser, which may be detected by a probe laser photodetector. The magnitude of the electric field component of the incoming RF radiation and its center frequency detuning from atomic resonance may be determined by measuring the magnitude and asymmetry of spectral splitting of the electromagnetically induced transparency (EIT), which is called Autler-Townes (AT) splitting.

Rydberg atom-based RF sensors have emerged as a viable option for surpassing the sensitivity limits of traditional dipole antenna-based receivers, while also reducing the Size, Weight and Power (SWaP), and enabling broad frequency coverage. However, current Rydberg sensors have not realized their theoretical sensitivity limits. The best experimental demonstrations currently provide greater than 35 dB lower sensitivity than theoretical predictions. Accordingly, the best demonstrations are only on par with traditional RF dipole antenna sensitivities. Also, reported sensitivities are misleading because the numbers do not scale with bandwidth when bandwidths are greater than about ten times the dephasing time of the atomic ensemble, e.g., about 1 MHz.

SUMMARY OF THE INVENTION

In general, a Rydberg sensor may comprise an array of Rydberg quantum radio frequency (QRF) cavities arranged in a plurality of rows and columns. A probe laser source may be configured to generate a plurality of time delayed probe beams for respective ones of the plurality of rows of Rydberg QRF cavities. An RF signal source may be configured to generate a plurality of time delayed RF signals for respective ones of the plurality of columns of Rydberg QRF cavities.

The time delays of the time delayed probe beams may correspond to time delays of the time delayed RF signals. A plurality of detectors for the plurality of rows of Rydberg QRF cavities may be opposite the probe laser source. A controller may operate the probe laser source, RF signal source, and the plurality of detectors.

A coupling laser source may be configured to generate a plurality of coupling beams for the plurality of columns of Rydberg QRF cavities. Each Rydberg QRF cavity may comprise a Rydberg sensing region and an optical amplifier associated therewith. Each Rydberg QRF cavity may comprise an arrangement of optical elements. The arrangement of optical elements may comprise a first mirror between the coupling laser source and a first end of the optical amplifier, and a second mirror between the probe laser source and a second end of the optical amplifier. The arrangement of optical elements may comprise a first reflector adjacent a first end of the Rydberg sensing region and aligned with the first mirror, and a second reflector adjacent a second end of the Rydberg sensing region and aligned with the second mirror.

Another aspect is directed to a method for Rydberg sensing that may comprise operating a probe laser source to generate a plurality of time delayed probe beams for respective ones of a plurality of rows of Rydberg quantum radio frequency (QRF) cavities in an array of Rydberg QRF cavities arranged in a plurality of rows and columns. The method may include operating an RF signal source to generate a plurality of time delayed RF signals for respective ones of the plurality of columns of Rydberg QRF cavities.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout, and prime notation is used to indicate similar elements in different embodiments.

Figure 1:
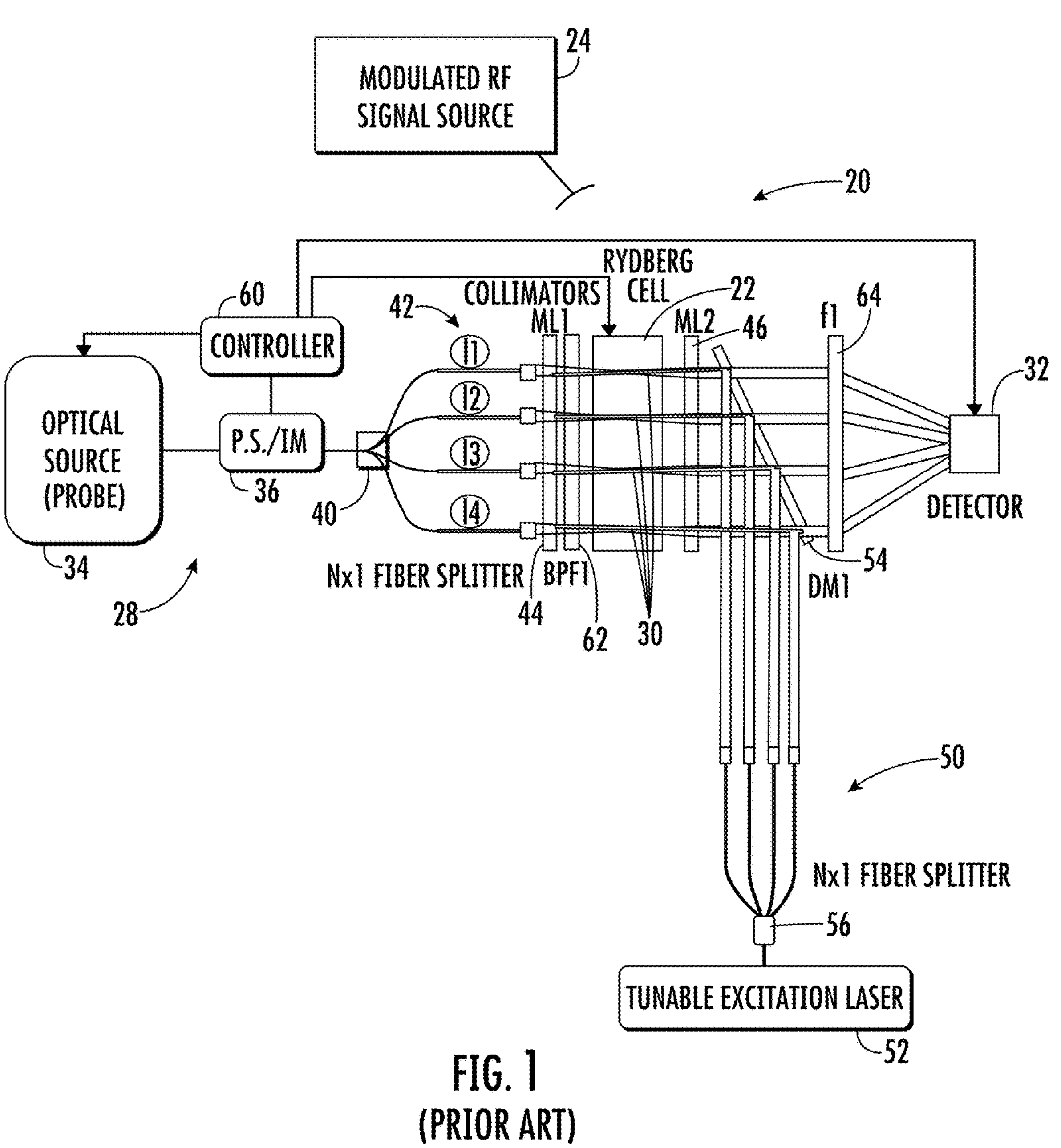
FIG. 1 is a schematic diagram of a known Rydberg sensor.
Figure 2:
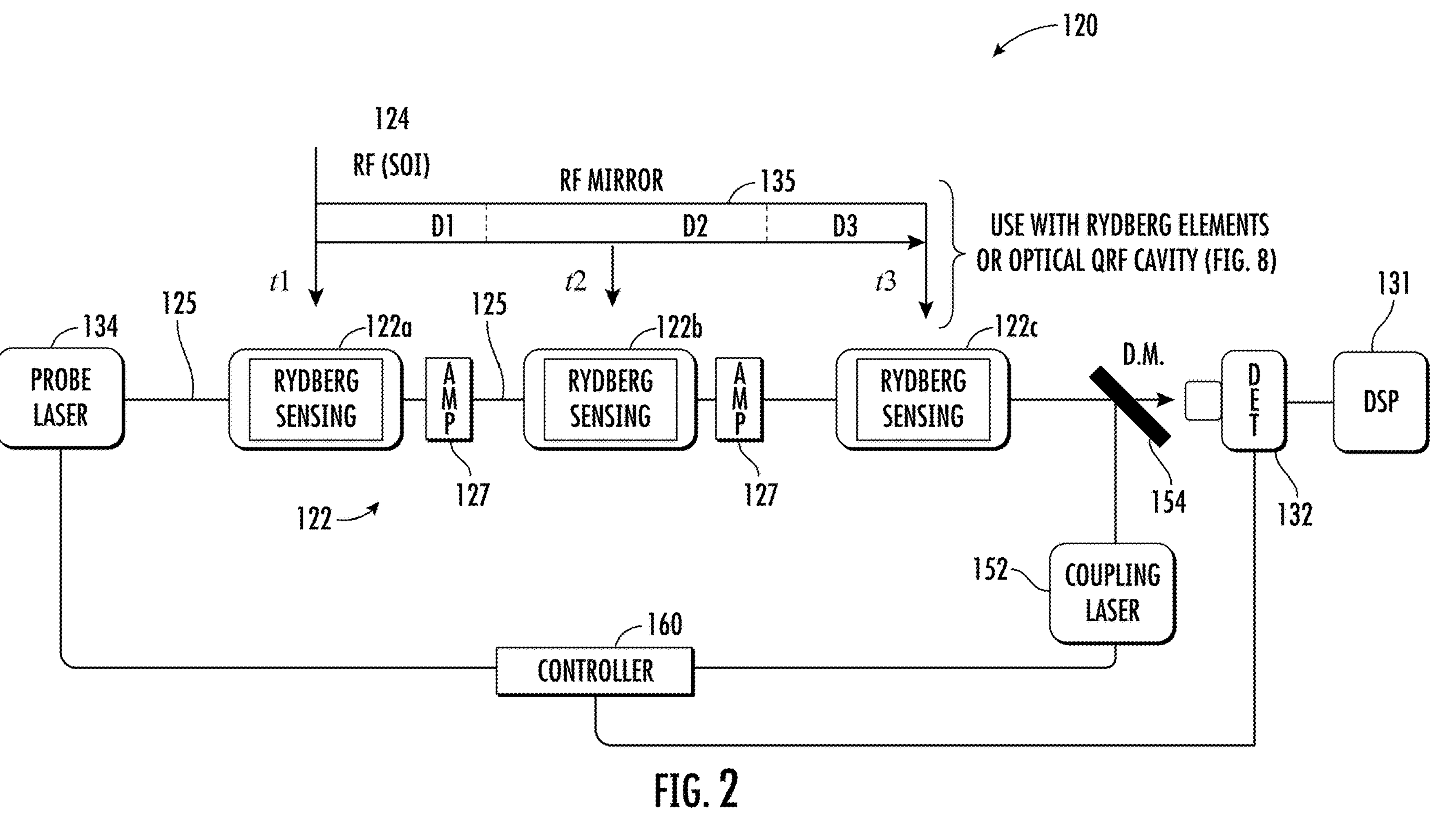
FIG. 2 is a schematic diagram of the Rydberg sensor that includes Rydberg sensing regions in a series configuration and at least one optical amplifier according to the invention.

There now follows a description of a known Rydberg sensor receiver that operates as a Spatiotemporal Multiplexing (STM) Rydberg sensor receiver for high data sampling rate as explained relative to FIG. 1, followed by the approach that optimizes the visibility of the sensor by optimizing the optical readout efficiency, such as by daisy chaining a plurality of Rydberg sensing regions as single Rydberg elements in a series configuration. At least one optical amplifier for the probe laser source may be coupled within the optical path between at least one adjacent pair of Rydberg sensing regions as shown in FIG. 2. The Rydberg Sensing Regions in FIG. 2 may each be formed as an optical cavity, i.e., an optical quantum radio frequency (QRF) cavity configuration shown in FIG. 8, which may also be termed a Rydberg QRF cavity.

Reference is made to the Rydberg sensing regions described in copending U.S. patent application Ser. Nos. 18/762,724 and 18/762,734, both filed on Jul. 3, 2024, and assigned to Eagle Technology, LLC, the disclosures which are hereby incorporated by reference in their entirety.

In the embodiments described with reference to FIGS. 13-20 and explained below, Rydberg QRF cavities are spatiotemporally multiplexed to maximize the visibility of the Rydberg sensing, allowing the standard quantum limit (SQL) to be approached, and even surpassed for certain instantaneous bandwidths. For example, through spatial and temporal multiplexing of the RF signal of interest, and the probe laser beam along with use of the Rydberg QRF cavities, with gain resonant with the probe laser beam, the visibility of the Rydberg measurement may be maximized, allowing the standard quantum limit (SQL) to be approached, and even surpassed for certain instantaneous bandwidths.

Referring to FIG. 1, a known Spatiotemporal Multiplexing (STM) Rydberg sensor, also referred to as a Rydberg sensor receiver, is illustrated generally at 20 and includes a Rydberg cell 22 that is configured to be exposed to a radio frequency (RF) signal generated from a modulated RF signal source 24. This RF signal source 24 may include a non-modulated RF local oscillator. A laser probe source indicated generally at 28 is configured to generate a plurality of spaced apart pulsed probe beams within the Rydberg cell 22 and generally shown at 30, with the pulsed probe beams being offset in time from one another. It should be understood that one or more Rydberg cells may be used with the probe beams in multiple Rydberg cells. A detector 32 is positioned downstream from the Rydberg cell 22. In the illustrated example, the detector 32 is formed from a photodetector cell. The probe source 28 is configured to generate the plurality of spaced apart pulsed probe beams 30 in an example without scanning and may be formed as an optical source 34 with a pulse shaper 36 that is downstream from the optical source. The Rydberg sensor receiver 20 may work with and without scanning the probe beam. The pulse shaper 36 may be an intensity modulator.

In the illustrated example, the probe source 28 includes a beam splitter 40, such as a N×1 fiber splitter, downstream from the pulse shaper 36 and a respective optical delay element 42 in a path of each beam downstream from the beam splitter. Each optical delay element 42 may be formed as a respective different length of optical fiber shown by the loops indicated as L1, L2, L3 and L4. A first microlens 44 is positioned adjacent a first side of the Rydberg cell 22 and a second microlens 46 is positioned adjacent a second side of the Rydberg cell as illustrated by the designations ML1 and ML2.

An excitation source 50 as a coupling laser is coupled to the Rydberg cell 22 and formed as a tunable excitation laser 52 and at least one mirror 54, such as a dichroic mirror downstream therefrom to input the output of the excitation laser and excite the rubidium or cesium used within the Rydberg cell 22. For a 4-beam version, as shown in FIG. 1, the N×1 fiber splitter 56 is a 4×1 splitter and may split the output into four beams from the excitation laser 50 corresponding to the illustrated four probe beams 30. A controller 60 is coupled to the Rydberg cell 22, the optical source 34 as the laser probe of the probe source 28, and detector 32. The delay mechanism may not only delay tunability as noted above, but also direct modulation temporal gating of one or more excitation lasers 52.

As illustrated, a bandpass filter (BPF1) 62 may be included to block the excitation laser 52 and pass the spaced apart probe beams 30. This component may be a wavelength division multiplexer or a dichroic mirror. A plano convex lens (f1) 64 may focus the probe beams 30 to the detector 32. The first microlens 44 and bandpass filter 62 may be formed as a collimator device, e.g., a Thorlabs Part No. 50-780, and have a collimator output with about a 0.5 mm spot size beam at 780 nanometers as generated from the optical source 34 as a laser.

The Rydberg cell 22 is a rubidium Rydberg cell, such as Thorlabs part no. GC19075-RB. Other vapors of specific atomic elements may include Cesium (Cs), Potassium (K), Sodium (Na), and possibly Iodine (I). The Rydberg sensor receiver 20 as illustrated will temporally and spectrally shape the signature of the pulsed probe beams 30, and thus, allows an increase in the sampling rate as proportional to the number of beams "N." Increasing the sampling rate is also dependent on the probe repetition rate. Separating the probe source 28 as a probe laser beam into N distinct pulses, each of which interrogates a distinct volume of the Rydberg cell 22, will increase the sampling of an incoming RF field in proportion to the number of beams "N." In addition to increasing the sampling rate, the bandwidth of the probe pulses may also help reduce the latency usually incurred by scanning the probe beam across the EIT spectrum. This may reduce the latency from about 1 to 2 orders of magnitude. The temporal pulse width of the probe determines its spectral bandwidth through a Fourier transform.

It is possible to increase the probe bandwidth generated from the optical source 34 from about 100 KHz to about 200 MHz by choosing an appropriate pulse width. The incoming RF field may be mapped onto a spectroscopic fingerprint without scanning. The Rydberg sensor receiver 20 captures a response directly correlated to the integrated line absorption spectrum, i.e., the equivalent width for the case of the spectral character of the source propagating through the atomic vapor at/near the frequency of an atomic absorption line modified by the pressure of EIT. Further details of the Rydberg sensor 20 described with respect to FIG. 1 are explained in U.S. Pat. No. 11,598,798 to Bucklew et al., assigned to Eagle Technology, LLC, the disclosure which is hereby incorporated by reference in its entirety.

As will be explained with reference to the embodiments shown in FIGS. 2-12, it is possible to increase the Rydberg sensor's sensitivity by increasing the number of atoms participating in the measurement and increase its optical visibility in discerning changes in RF power by increasing the length of the absorbing medium. Increasing the number of atoms by increasing the concentration of the atoms in a shorter Rydberg cell may cause clamping due to adverse effects of atom-atom interactions, such as blockades and Doppler effects. Increasing the Rydberg cell length alone may cause the probe laser beam to be absorbed, which may degrade the effective interaction length that may be achievable. These technical drawbacks are addressed and overcome by the Rydberg sensor 120, 120' explained with reference to FIGS. 2-12 by daisy chaining a plurality of Rydberg sensing regions as separate Rydberg elements in a series configuration with at least one optical amplifier, or using an optical cavity as an optical quantum radio frequency (QRF) cavity 145' (FIG. 8) that is not an RF cavity, but an optical cavity that incorporates a Rydberg element, such as a Rydberg cell. The cavity of FIG. 8 may be referred to as an optical QRF cavity or QRF cavity.

Figure 6A:
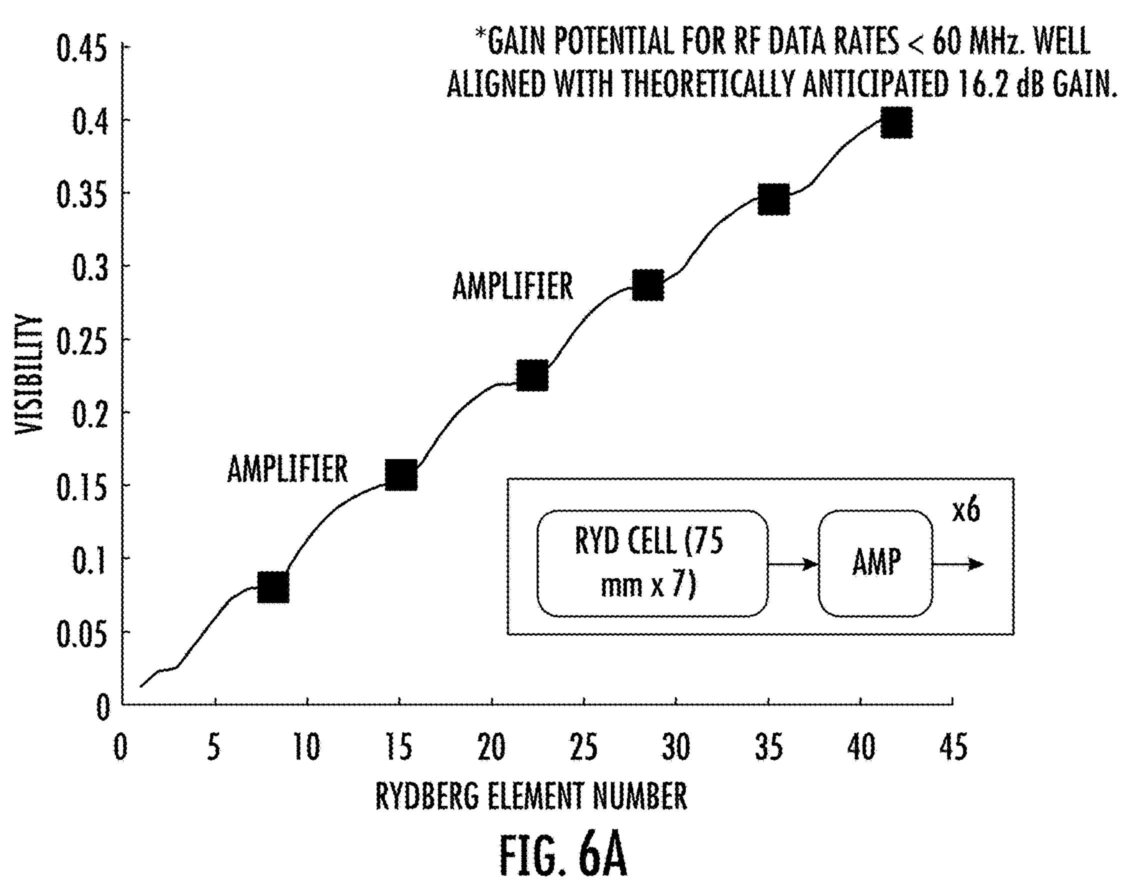
FIG. 6A is a graph showing a Rydberg sensor model according to the invention and the increase in visibility with six series connected Rydberg cells with amplification.
Figure 6B:
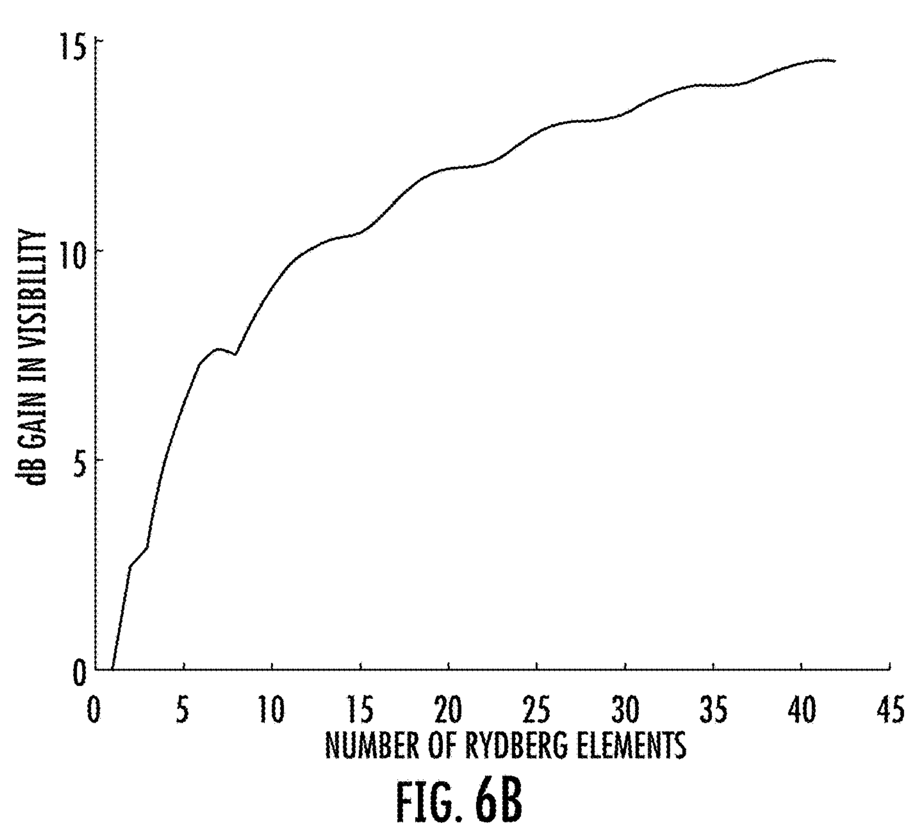
FIG. 6B is a graph of the Rydberg sensor model showing a 15 decibel gain in visibility for the six series connected Rydberg cells with amplification as in FIG. 6A.
Figure 7:
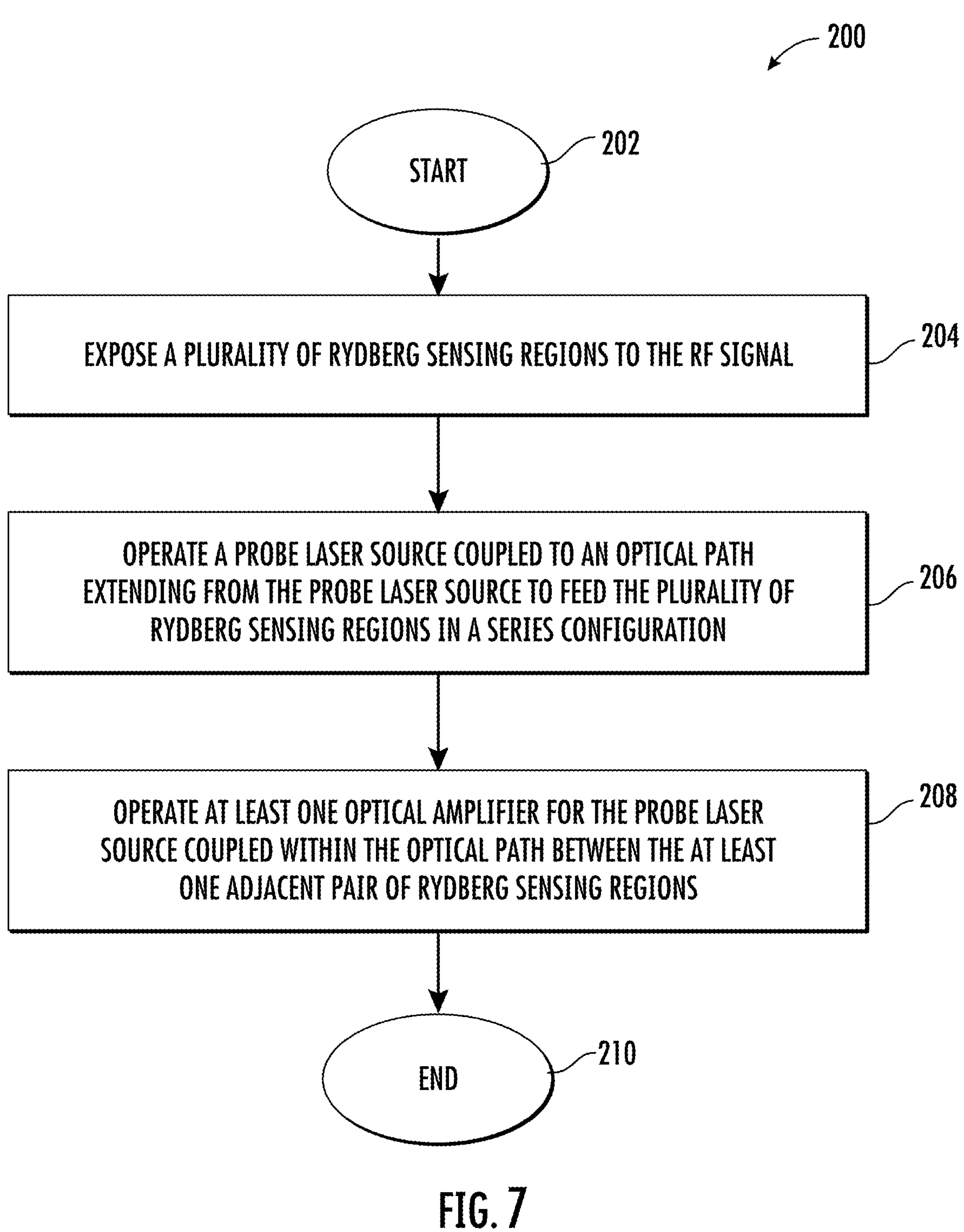
FIG. 7 is a flowchart showing a method for receiving an RF signal using the Rydberg sensor of FIG. 2 according to the invention.
Figure 8:
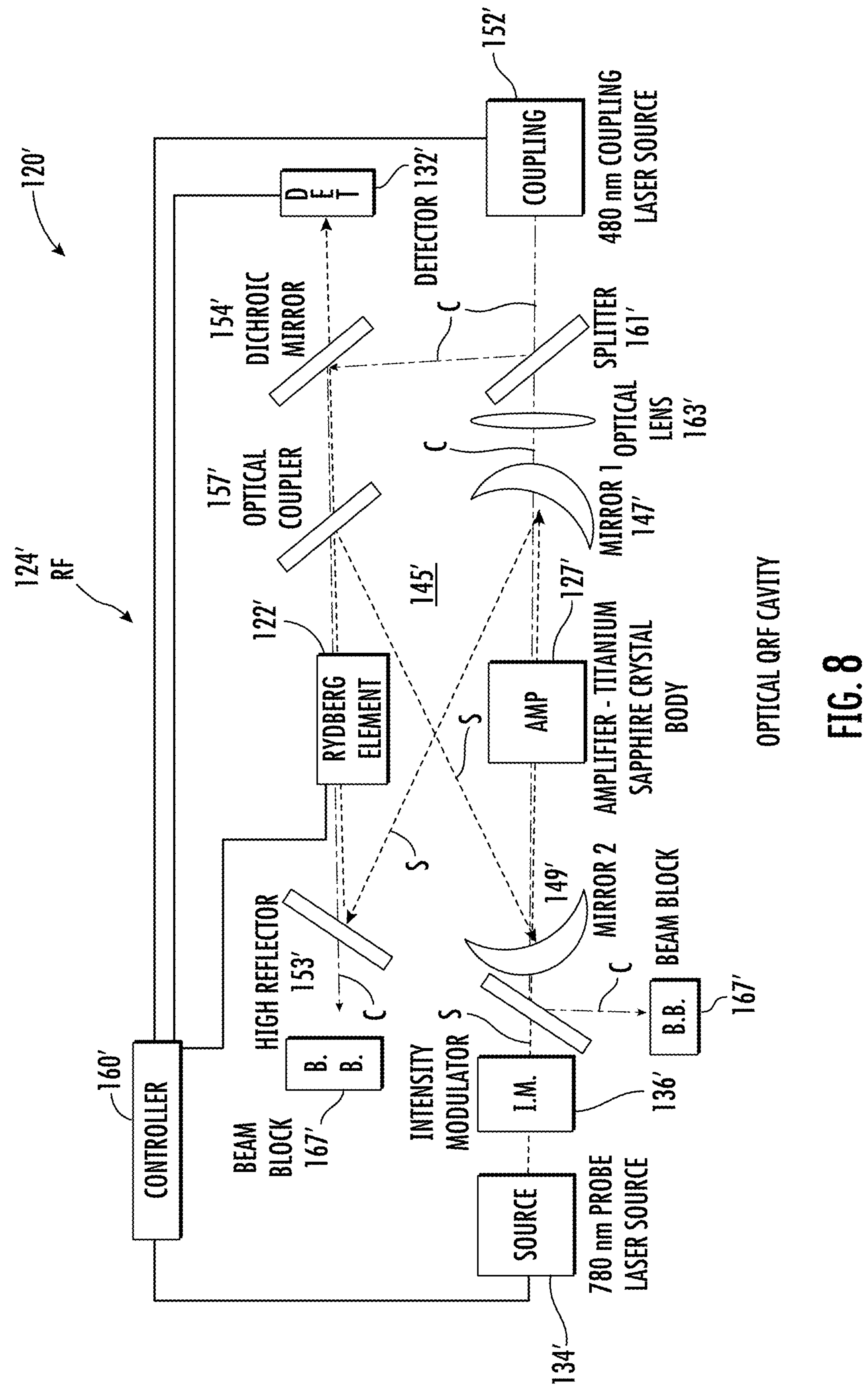
FIG. 8 is a schematic diagram of a second embodiment of the Rydberg sensor employing a quantum radio frequency (QRF) cavity according to the invention.

Similar components and elements for the Rydberg sensor 120, 120' embodiments described relative to FIGS. 2-12, are given common reference numerals in the 100 series. The second embodiment of FIG. 8 shows in detail the configuration of the optical cavity that incorporates a Rydberg element, such as a Rydberg cell and that optical cavity may be termed QRF cavity or optical QRF cavity 145', and the reference numerals are given in prime notation.

As shown in FIG. 2, the Rydberg sensor 120 includes a plurality of Rydberg sensing regions 122 with each individual Rydberg sensing region numbered 122*a*, 122*b*, 122*c* and a probe laser source 134. Although three Rydberg sensing regions 122*a*, 122*b*, 122*c* are shown, a greater number may be employed depending on design and end use applications. The plurality of Rydberg sensing regions 122 in an example may be formed as a plurality of Rydberg elements as gas cells, such as described above, or in the configuration of the cavity 145' shown in FIG. 8, which incorporates a Rydberg element and other optical elements as explained below. This Rydberg sensing region 122 may be a Rydberg cell or element and formed as a gas in a hollow core fiber or a bulk element. The optical cavity, i.e., optical QRF cavity 145', may be a solid state free space cavity or could be an optical fiber cavity. An optical path 125 extends from the probe laser source 134 to feed the plurality of the Rydberg sensing regions 122 in a series configuration similar to a daisy chain. The optical path 125 may be formed as an optical fiber or other optical medium, such as a gas or vacuum or free space as non-limiting examples.

At least one optical amplifier 127 for the probe laser source 134 is coupled within the optical path 125 between at least one adjacent pair of Rydberg sensing regions 122*a*, 122*b*, 122*c*. In an example, a plurality of optical amplifiers 127 are included, with each optical amplifier positioned between adjacent pairs of the Rydberg sensing regions 122. The optical amplifiers 127 cooperate with the plurality of Rydberg sensing regions 122*a*, 122*b*, 122*c*, effectively increasing the cell length, while maintaining the concentration of atoms in the Rydberg sensing regions. The absorption of the laser beam generated from the probe laser source 134 is mitigated or counterbalanced in this configuration, and thus, a higher sensitivity and visibility is obtained.

In an example, a coupling laser source 152 is coupled to the optical path 125 via a dichroic mirror 154. Although one coupling laser source 152 and one probe laser source 134 are illustrated, two or more coupling laser sources and two or more probe laser sources may be used. A detector 132, such as a photodetector, is downstream from the plurality of Rydberg sensing regions 122*a*, 122*b*, 122*c*. A controller 160 is coupled to the probe laser source 134, the coupling laser source 152, and the detector 132 to control operation of the lasers and detector. Signals received at the detector 132 may be further analyzed at the controller 160, and in this example, at a digital signal processor (DSP) 131 connected to the detector.

At least one time delay element 135 is coupled between the at least one optical amplifier 127 and an input signal of interest (SOI) 124, which in this example may be a RF signal, such as by deploying use of a time delay element formed as a radio frequency (RF) mirror. In an example, one RF mirror 135 as the time delay element may be used to split and/or reflect the RF signal 124 with the appropriate delay into the series configured Rydberg sensing regions 122*a*, 122*b*, 122*c*. The time delay element 135 may preferably be used with the optical cavity, i.e., optical QRF cavity 145' configuration explained relative to FIG. 8 when cavities are placed in series. This delay may be accomplished by a plurality of time delay elements 135, such as a respective delay path in an RF mirror with the time delay elements shown by the dashed configuration splitting into three delay elements in FIG. 2 labeled D1, D2 and D3. The incoming RF signal 124 is split and delayed so that the RF signal being measured arrives at a subsequent Rydberg sensing region 122*a*, 122*b*, 122*c* at the same time as the probe laser 134 to increase the interaction region beyond that possible with a single Rydberg sensing region 122, such as an optical cavity, i.e., QRF cavity 145'.

It is possible to match the delay from the probe laser source 134 and the RF waveform 124 being measured to increase the sensitivity beyond the limits of a single Rydberg sensing region 122, which would be clamped by the data modulation rate of the RF signal being measured. The use of the series configured Rydberg sensing regions 122 in a daisy chain configuration enhances the Rydberg sensor 120 sensitivity and increases data rates. In a non-limiting example, at 1 MHz and with three Rydberg sensing regions 122*a*, 122*b*, 122*c*, each having a 36 dB enhancement and employing reflection and delay from the RF signal 124, it is possible to achieve 108 dB enhancement in the Rydberg sensor 120. With the use of the optical cavity, i.e., optical QRF cavities 145' in the series configuration, additional losses from the RF mirrors and splitting may reduce this enhancement, but there is monotonous increase with the number of Rydberg sensing regions 122' due to multiple cavities in series.

Figure 3:
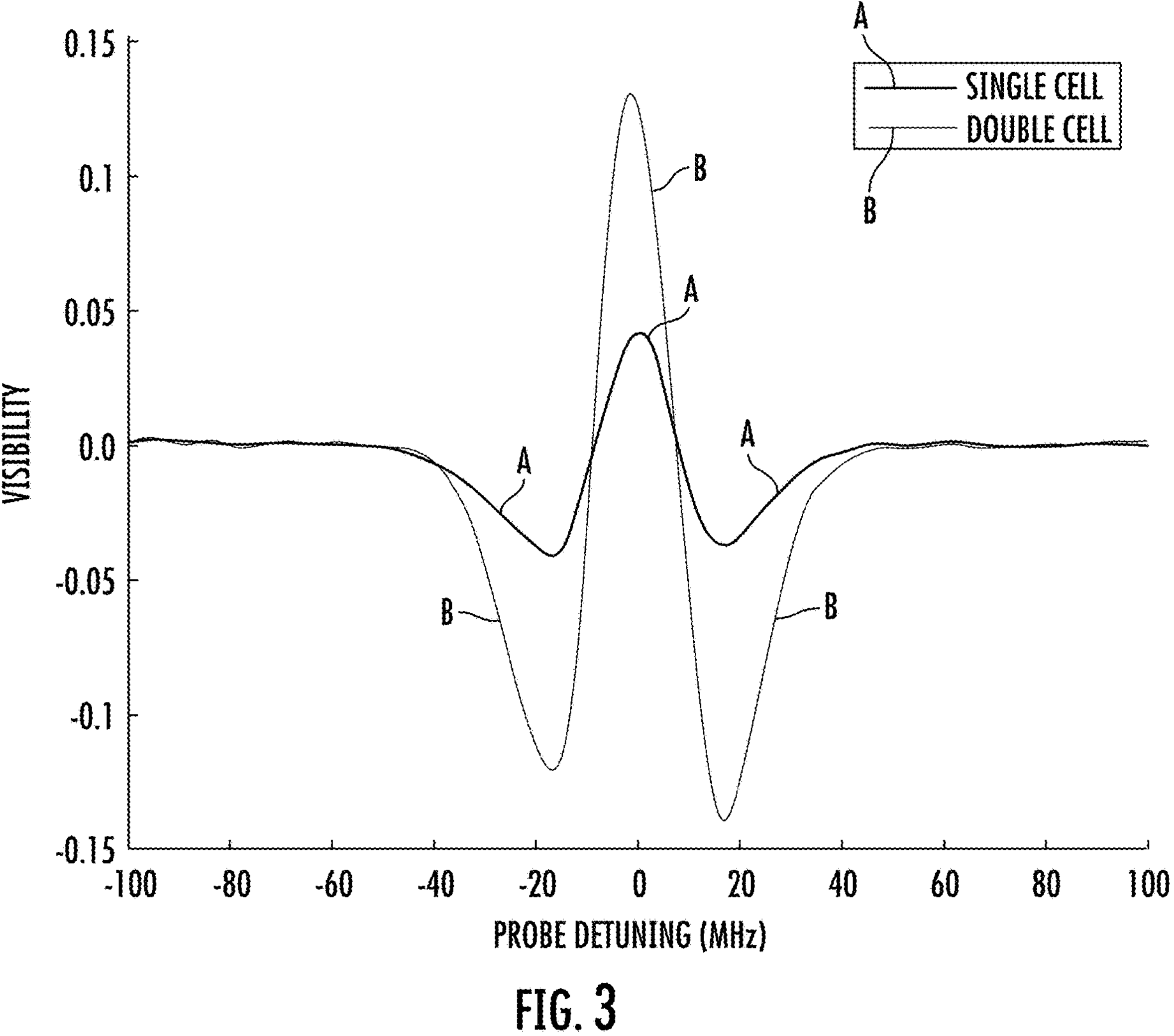
FIG. 3 is a graph of a Rydberg sensor model comparing visibility obtained with one versus two Rydberg sensing regions.

Referring now to FIG. 3, there is illustrated a graph showing the experimental results for a Rydberg sensor model having two Rydberg sensing regions 122 in series and visibility at zero (0) detuning and showing the comparison between a single Rydberg sensing region 122 as a single Rydberg cell with two Rydberg sensing regions that are series configured double Rydberg cells. The single cell is shown by the line marked “A” and the double cell is shown by the line marked “B.” The graph shows an enhancement greater than three with the double Rydberg cells 122, and in this computer model, an enhancement of 3.14.

Figures 4A, 4B:
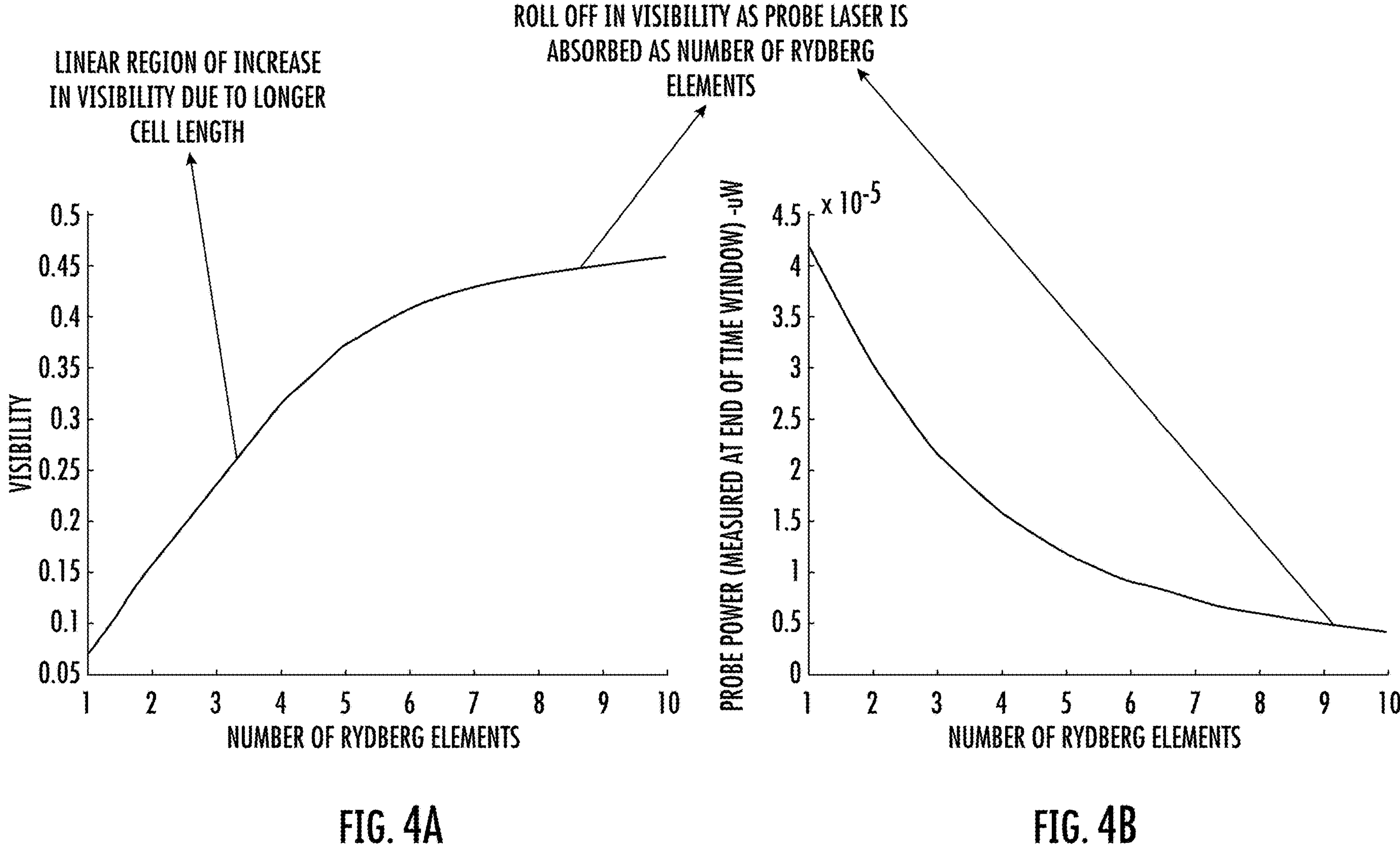
FIG. 4A is a graph of a Rydberg sensor model showing the roll off in visibility as the Rydberg cell length increases without amplification.
FIG. 4B is a graph showing a Rydberg sensor model and the reduction in probe power as the Rydberg cell length increases without amplification.

The graphs in FIGS. 4A and 4B show numerical results in an experimental Rydberg sensor 120 model without employing optical amplifiers, where the number of Rydberg elements increase along the horizontal axis as shown in each graph. The graph in FIG. 4A shows the increase in visibility. The linear region of increase is due to the longer cell length with the increase in the number of Rydberg sensing regions 122 as Rydberg elements. The increase in visibility is shown in vertical axis of the graph in FIG. 4A relative to the number of Rydberg elements. The probe laser power that is measured at the end of the time window is shown in the vertical axis of the graph in FIG. 4B. Both graphs of FIGS. 4A and 4B show the roll off in visibility as the probe laser 134 is absorbed and the number of Rydberg sensing elements 122 increases.

Figure 5A:
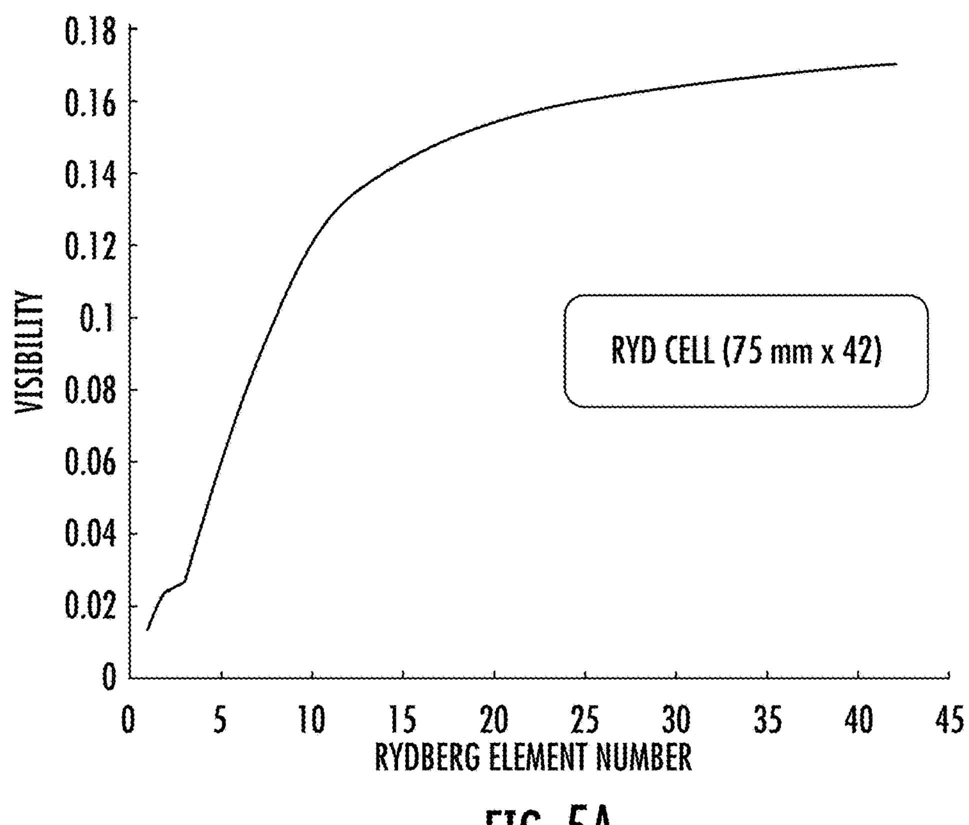
FIG. 5A is a graph of a Rydberg sensor model showing an increase in visibility using a long Rydberg cell without amplification.
Figure 5B:
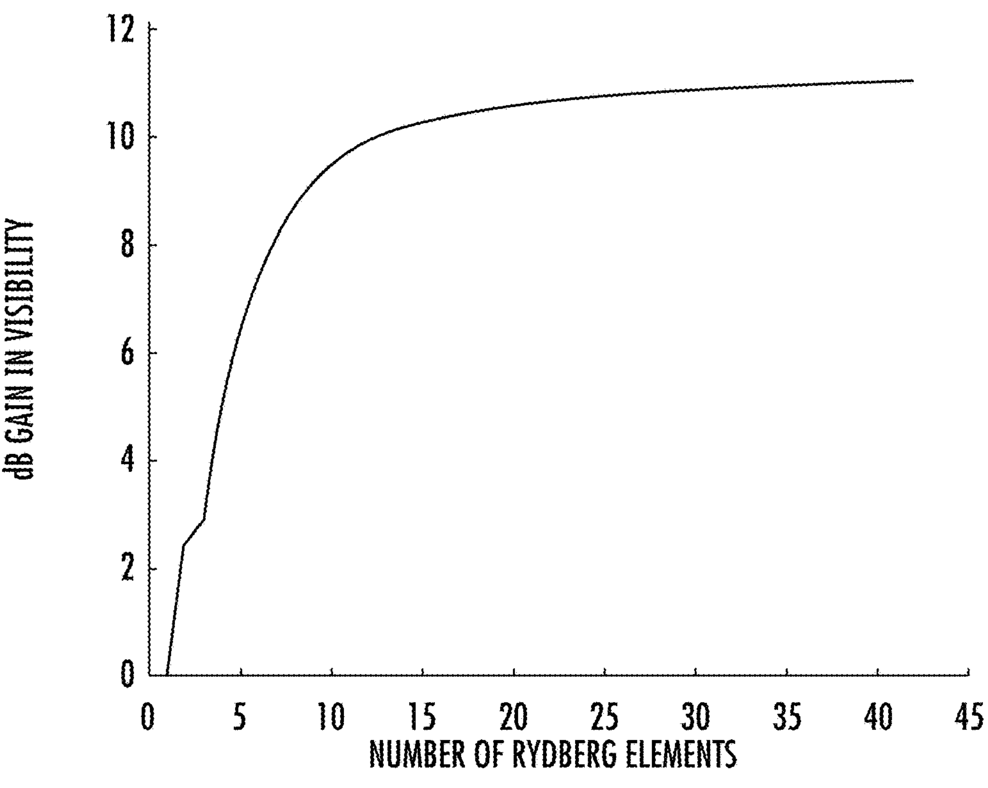
FIG. 5B is a graph showing a Rydberg sensor model and the 10 decibel gain for the long Rydberg cell as in FIG. 5A.

The graphs of the Rydberg sensor models for FIGS. 5A and 5B may be compared with the graphs of FIGS. 6A and 6B. In the graphs of FIGS. 5A and 5B, a long Rydberg sensing region 122 without amplification is employed in a Rydberg sensor cell that is 75 millimeters by 42 elements, showing the increase in visibility in the graph of FIG. 5A, and the decibel gain in visibility of about 10 dB gain shown in the graph of FIG. 5B. These graphs may be compared to the daisy chain or series configured Rydberg sensing regions 122 as Rydberg elements with optical amplifiers, such as the Rydberg sensor 120 in FIG. 2 without the RF mirror 135, but with six amplified Rydberg sensing regions 122 as Rydberg elements in series. The graph in FIG. 6A shows the increase in visibility beyond that shown by the single longer Rydberg cell in FIG. 5A, with the 15 dB gain shown in the graphs of FIG. 6B. These graphs illustrate the benefit of using a plurality of Rydberg sensing regions 122 as Rydberg elements and at least one optical amplifier 127 for the probe laser source 134 coupled within the optical path 125 between at least one adjacent pair of Rydberg sensing regions.

Referring now to FIG. 7, there is illustrated generally at 200 a flowchart showing an example method of receiving a radio frequency (RF) signal 124. The method starts (Block 202) and a plurality of Rydberg sensing regions 122 are exposed to an RF signal 124 (Block 204). The method includes operating a probe laser source 134 coupled to an optical path 125 extending from the probe laser source to feed the plurality of Rydberg sensing regions 122 in a series configuration (Block 206). The method further includes operating at least one optical amplifier 127 for the probe laser source 134 coupled within the optical path 125 between at least one adjacent pair of Rydberg sensing regions 122 (Block 208). The process ends (Block 210).

Referring now to FIG. 8, there is illustrated a Rydberg sensor 120' that employs an optical cavity as i.e., an optical quantum radio frequency (QRF) cavity 145' to increase the gain and visibility of the Rydberg sensor. Using the optical QRF cavity 145' design, the probe laser source 134' power and RABI frequency are updated after each pass through a Rydberg sensing region 122' in this example as the illustrated Rydberg element as part of the QRF cavity. The RABI frequency is that frequency at which probability amplitudes of two atomic energy levels fluctuate in an oscillating electromagnetic field. For example, it may be proportional to the transition dipole moment of the two levels and to the amplitude, but not the intensity of the electromagnetic field. As noted before, a plurality of cavities 145' may be used in a series configuration similar to the configuration of the Rydberg sensor 120 of FIG. 2, taking advantage of the use of the delay element such as the RF mirror 135. In the description that follows, only one cavity 145' is described.

As shown in FIG. 8, the Rydberg sensor 120' in this example includes the probe laser source 134' and the optical QRF cavity 145' downstream from the probe laser source and configured to define a path for a plurality of probe laser beams that pass within the QRF cavity. As in the previous example shown in FIG. 2, the probe laser source 134' generates a 780 nanometer probe laser beam, but can vary depending on applications. In this example, the Rydberg sensing region 122' may be a Rydberg element, such as a gas cell, and within the QRF cavity 145' in the path of the plurality of probe laser beam passes. An optical amplifier 127' is within the QRF cavity 145' and in the path of the plurality of probe laser beam passes. The detector 132', in this example a photodetector, is downstream from the QRF cavity 145'. The QRF cavity 145' includes the Rydberg sensing region 122' as a Rydberg element, the optical amplifier 127', such as a titanium sapphire crystal body, first and second mirrors 147', 149', a first reflector as first “high” reflector 153', e.g., a mirror that reflects almost 99.99% of light at a specific wavelength, e.g., 780 nanometers, and a second reflector as an optical coupler 157'.

A coupling laser source 152' is configured to power the optical amplifier 127'. More than one coupling laser source 152' may be used. In this example, the coupling laser source 152' is a 480 nanometer coupling laser, but can vary depending on specific application. The QRF cavity 145' includes this arrangement of optical elements such as the first mirror 147' between the coupling laser source 152' and a first end of the optical amplifier 127' and the second mirror 149' between the probe laser source 134' and the second end of the optical amplifier 127'.

The arrangement of optical elements forming this optical QRF cavity 145' also includes the high reflector 153' as the first reflector adjacent a first end of the Rydberg sensing region 122' as a Rydberg element and aligned with the first mirror 147', and the optical coupler 157' as the second reflector adjacent a second end of the Rydberg sensing region 120' as a Rydberg element and aligned with the second mirror 149'. An optical splitter 161' is downstream from the coupling laser source 152', and a dichroic mirror 154' is upstream of the detector 132'. A controller 160' is coupled to the probe laser source 134' and the detector 132', and in this example, also to the coupling laser source 152' and Rydberg sensing region 122'. An optical lens 163' is between the splitter 161' and first mirror 147' to focus the coupling laser beam into the optical amplifier 127'.

In operation, the coupling laser source 152' provides gain to the optical amplifier 127', which is seeded by the 780 nanometer probe laser source 134' so that amplification at the optical amplifier occurs at about 780 nanometers within the QRF cavity 145'. The probe laser source 134' emits its 780 nanometer laser beam that is reflected by the first mirror 147' into the first reflector as the high reflector 153', which reflects the probe laser beam into the Rydberg sensing region 122' as a Rydberg element and through the optical coupler as the second reflector 157', through the dichroic mirror 159' into the detector 132'. At the same time, the probe laser beam from the probe laser source 134' is reflected off the second reflector 157' as the optical coupler back to the second mirror 149' and back through the optical amplifier 127' where it is then reflected again after amplification into the first or high reflector 153' and then to the Rydberg sensing region 122', thus forming another of the probe laser beam passes within the QRF cavity 145'. The 480 nanometer coupling laser beam from the coupling laser source 152' is split at the optical splitter 161' to pump the optical gain medium so that it provides gain to the 780 nm laser as it passes from the optical splitter. The beam is also split so that a portion of the coupling laser beam passes into the dichroic mirror 154' and feeds the Rydberg sensing region 122' as the Rydberg element. The laser path from the probe laser source 134' is labeled “S” and the path from the coupling laser source 152' is labeled “C.”

In this experimental setup for the Rydberg sensor 120', beam blocks 167' absorb the coupling laser beam for safety. The controller 160' controls operation of the probe laser source 134' and coupling laser source 152', not only to seed the wavelength of the probe laser beam to which the gain is applied, but also to determine whether the optical QRF cavity 145' is operated below a laser threshold, at a laser threshold, or above a laser threshold. It is possible to modify the 480 nanometer and 780 nanometer center laser frequencies to optimize either gain of the optical QRF cavity 145' or optimize performance at the Rydberg sensing region 122' as a Rydberg element in this example.

It is also possible to add an intensity modulator 136' as shown in FIG. 8 that may have its repetition rate and duty cycle changed to help fill the QRF cavity 145' with additional energy or reduce the energy level and make the QRF cavity more energy sparse. A modelocker element (not shown) may be optionally inserted within the QRF cavity 145', e.g., an acousto-optic modulator (AOM), or the QRF cavity design may support hard or soft KERR lens mode locking, or support a saturable absorber based modelocker, such as known to those skilled in art, and operate the QRF cavity 145' on the edge of pulsed or continuous wave states. The controller 160' may control any acousto-optic modulation repetition rate and match it to the QRF cavity 145' round trip time.

The optical QRF cavity 145' may also be operated such that small linear changes in the incoming radio frequency (RF) power from the signal of interest as the RF signal 124' may lead to large, non-linear changes in the optical state such as at the edge of any laser stability, for example, pulsed versus continuous wave (CW) states. The length of the QRF cavity 145' may also be controlled using piezoelectric mirrors, such as the first and second mirrors 147', 149', and shift the resonant frequencies of the QRF cavity 145' and align it with the transition resonances of the Rydberg sensor 120'.

It is also possible to insert an optical pulse picker into the optical QRF cavity 145' to dump optical radiation at desired times and quickly “reset” the Rydberg sensor 120' to make a new RF measurement of the RF signal 124' that enters into and is measured at the Rydberg sensing region 122'. The optical pulse picker may be formed as an electrically controlled optical switch that extracts single pulses from a fast pulse train. Other designs known to those skilled in the art may be used. The QRF cavity 145' design may be either stable or unstable, depending on the desired outputs. An unstable QRF cavity 145' may allow for more continuous sampling of RF radiation from the RF signal 124', but may not provide as much visibility enhancement as a stable QRF cavity, which may sparsely sample incoming RF radiation due to the need for the QRF cavity to reset after a certain number of round trips.

Figure 9A:
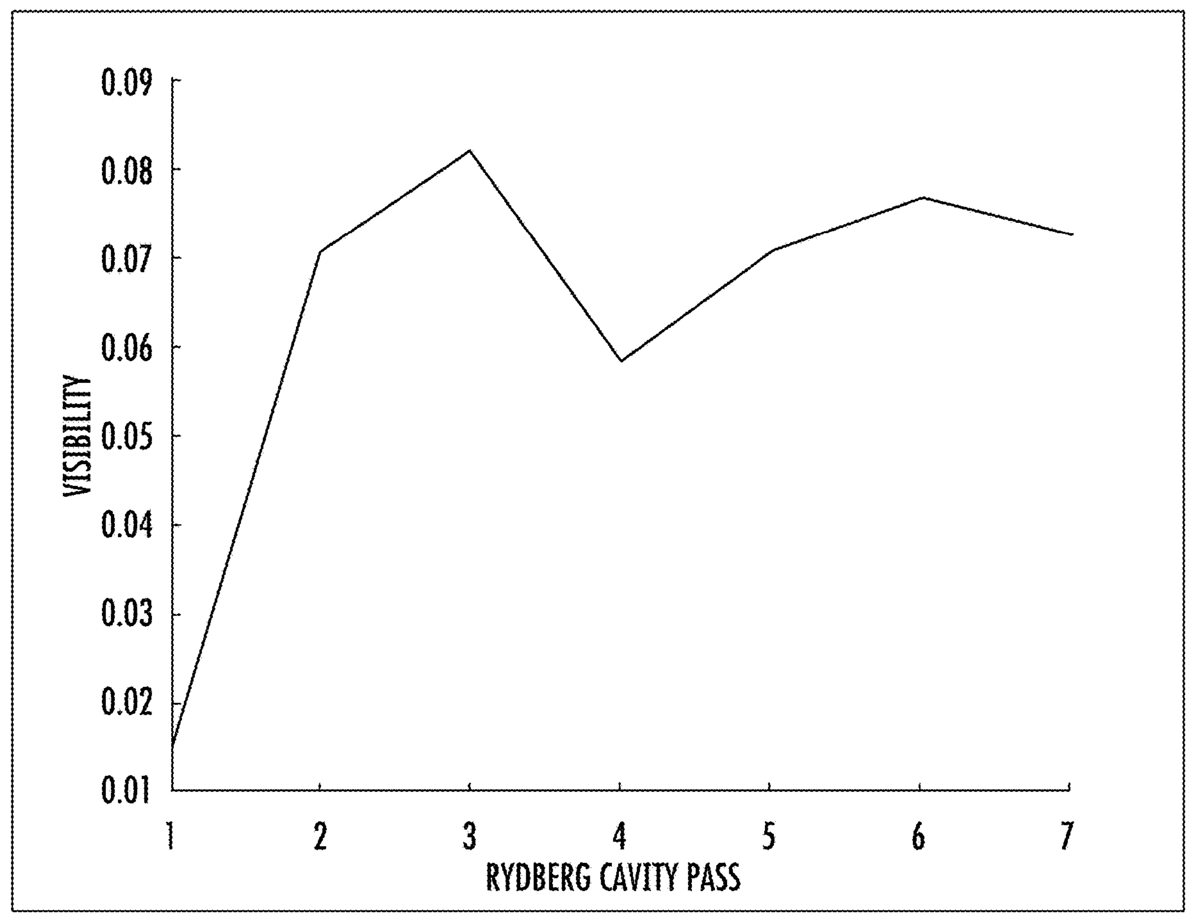
FIG. 9A is a graph of a Rydberg sensor model employing a QRF cavity without amplification and showing increased visibility.
Figure 9B:
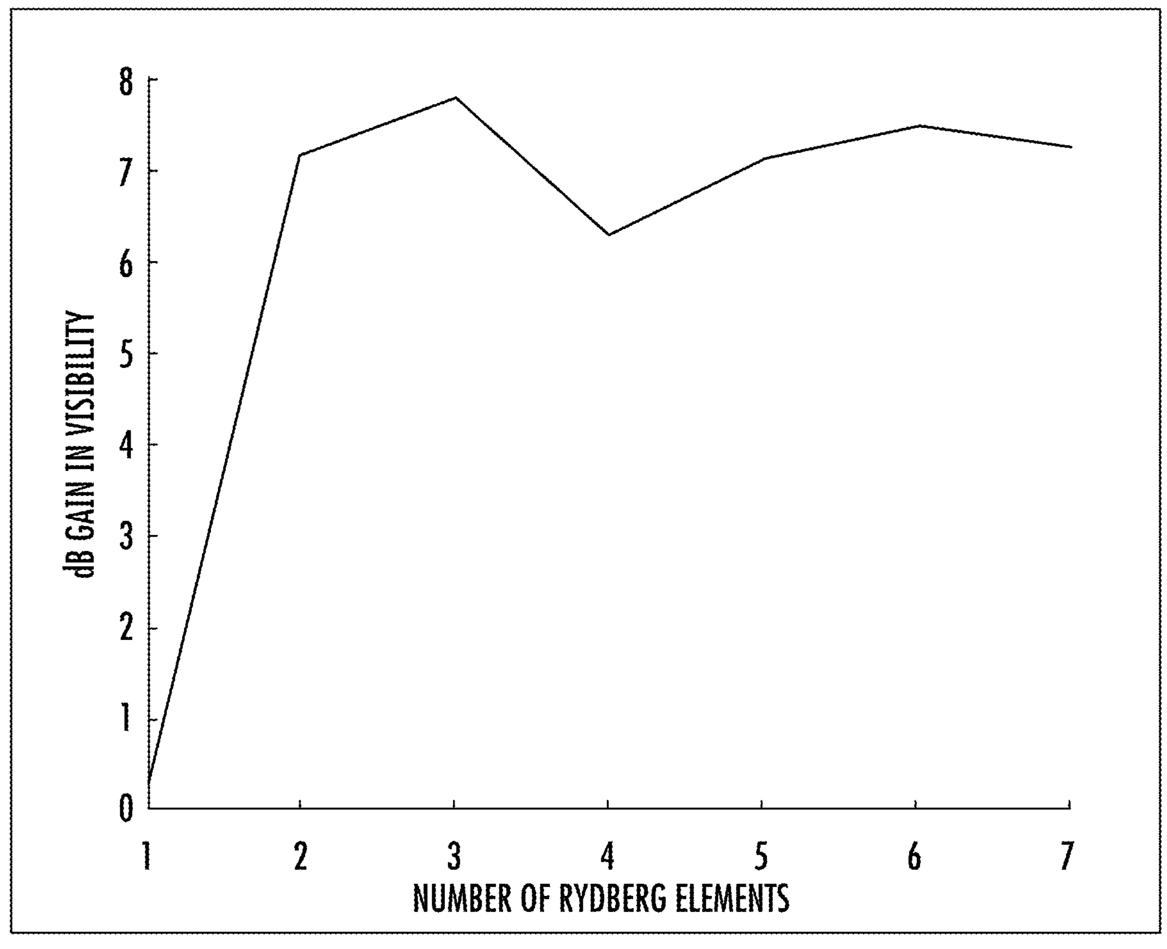
FIG. 9B is a graph of the Rydberg sensor model as in FIG. 9A showing the decibel gain in visibility.

Referring now to FIGS. 9A and 9B, the experimental results for a modeled optical QRF cavity of a Rydberg sensor with limited amplification shows the increase in visibility of the Rydberg sensor, where FIG. 9A shows the increase in visibility with a changing number in Rydberg cavity passes and the decibel gain increase shown in FIG. 9B. These graphs show the benefit of a cavity design.

Figure 10:
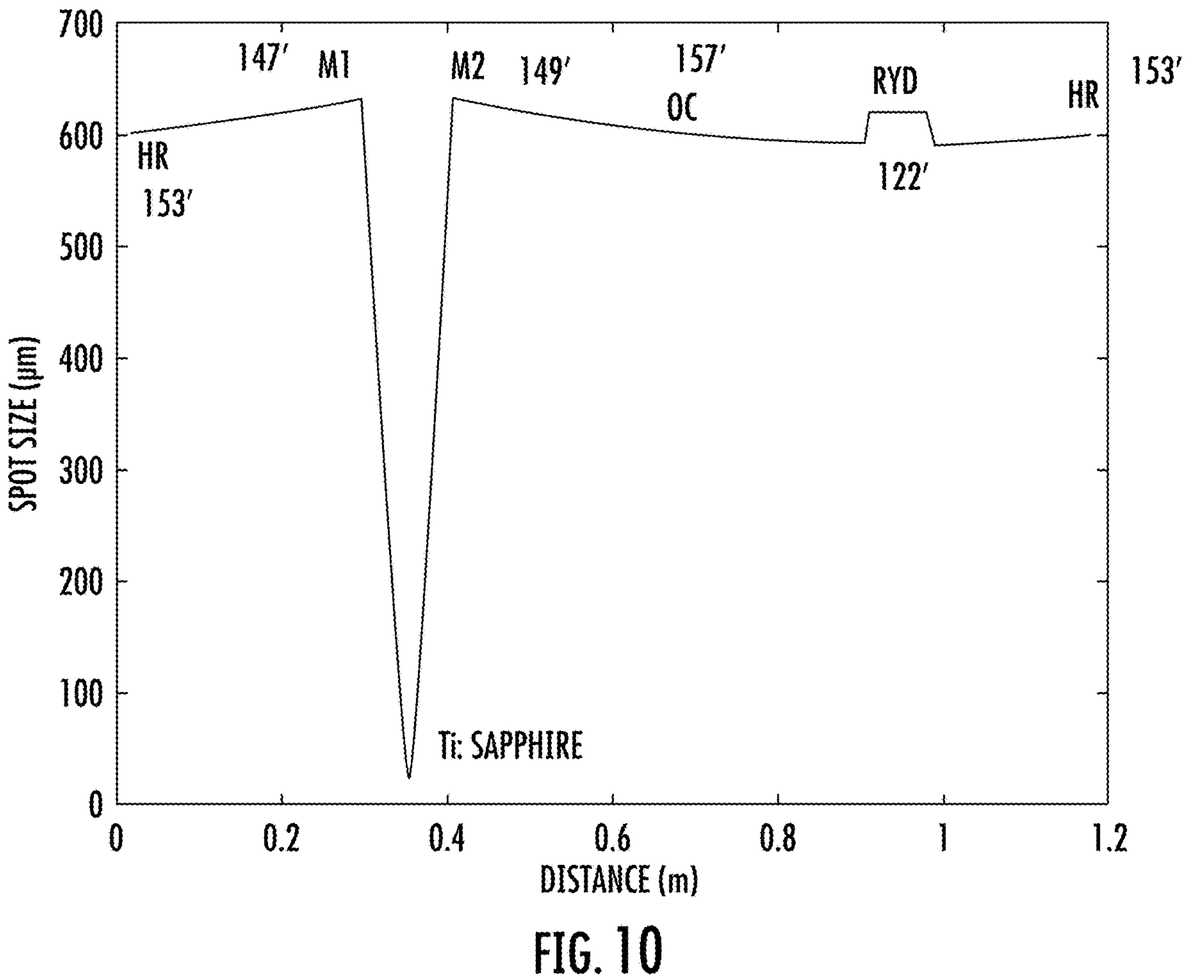
FIG. 10 is a graph showing the distance between components in the QRF cavity of the Rydberg sensor of FIG. 8.

The graph in FIG. 10 shows the distance in meters for various components in an experimental test platform of the optical QRF cavity 145' and shows the spot size from the first and second mirrors 147', 149' to the optical amplifier 127' as the titanium sapphire crystal body.

Figure 11:
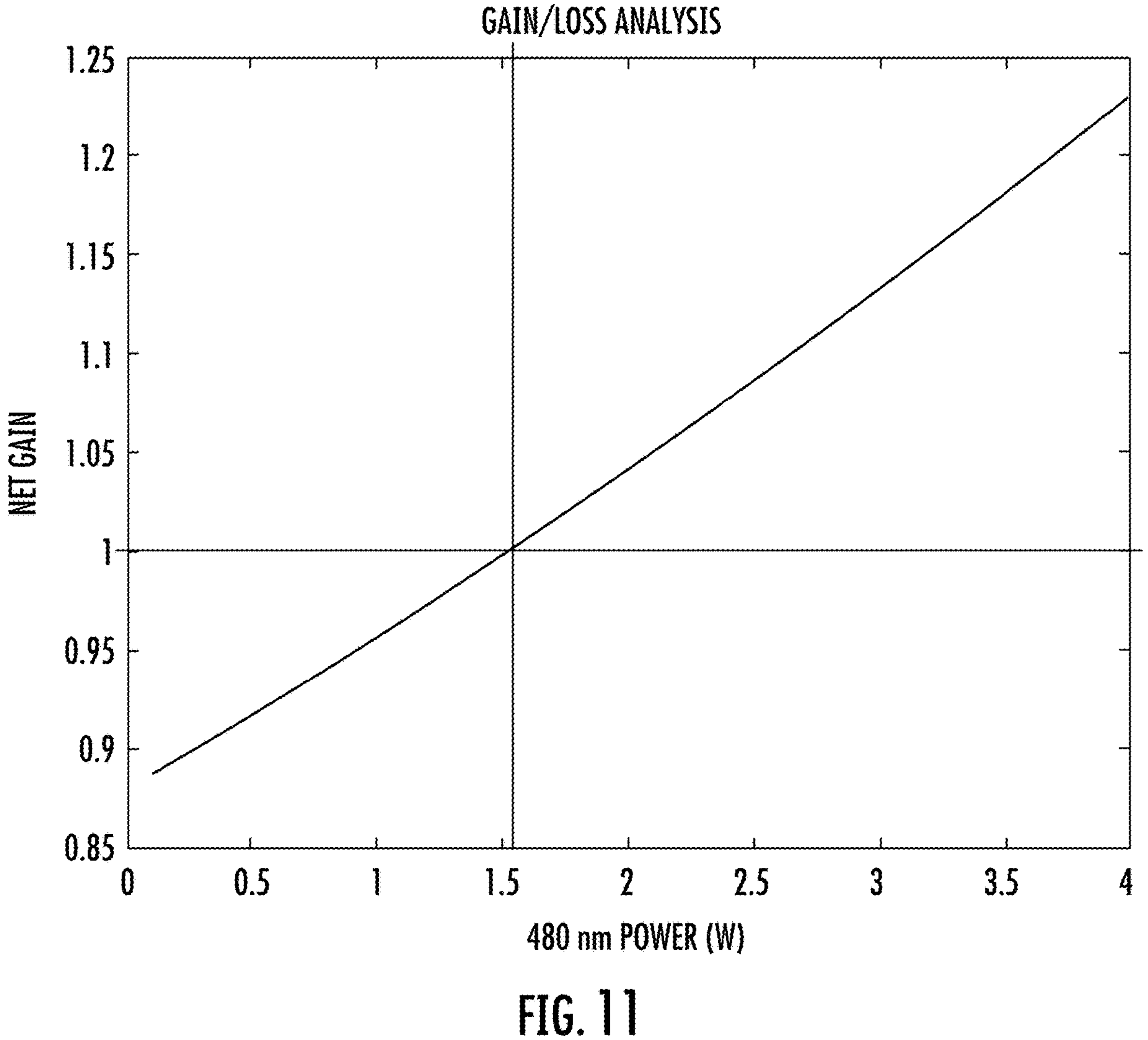
FIG. 11 is a graph showing the gain/loss analysis for the QRF cavity of FIG. 8.

An experimental gain/loss analysis is shown in the graph of FIG. 11 with the gain shown on the vertical axis and the coupling laser power as the 480 nanometer power in watts, indicative that 1.7 watts for the 480 nanometer QRF cavity 145' design is required, with 1.6 watts for the loss equalization, and 0.1 watts to drive the Rydberg sensing region 122' as a Rydberg element when the coupling laser beam is split at the splitter 161'.

Figure 12:
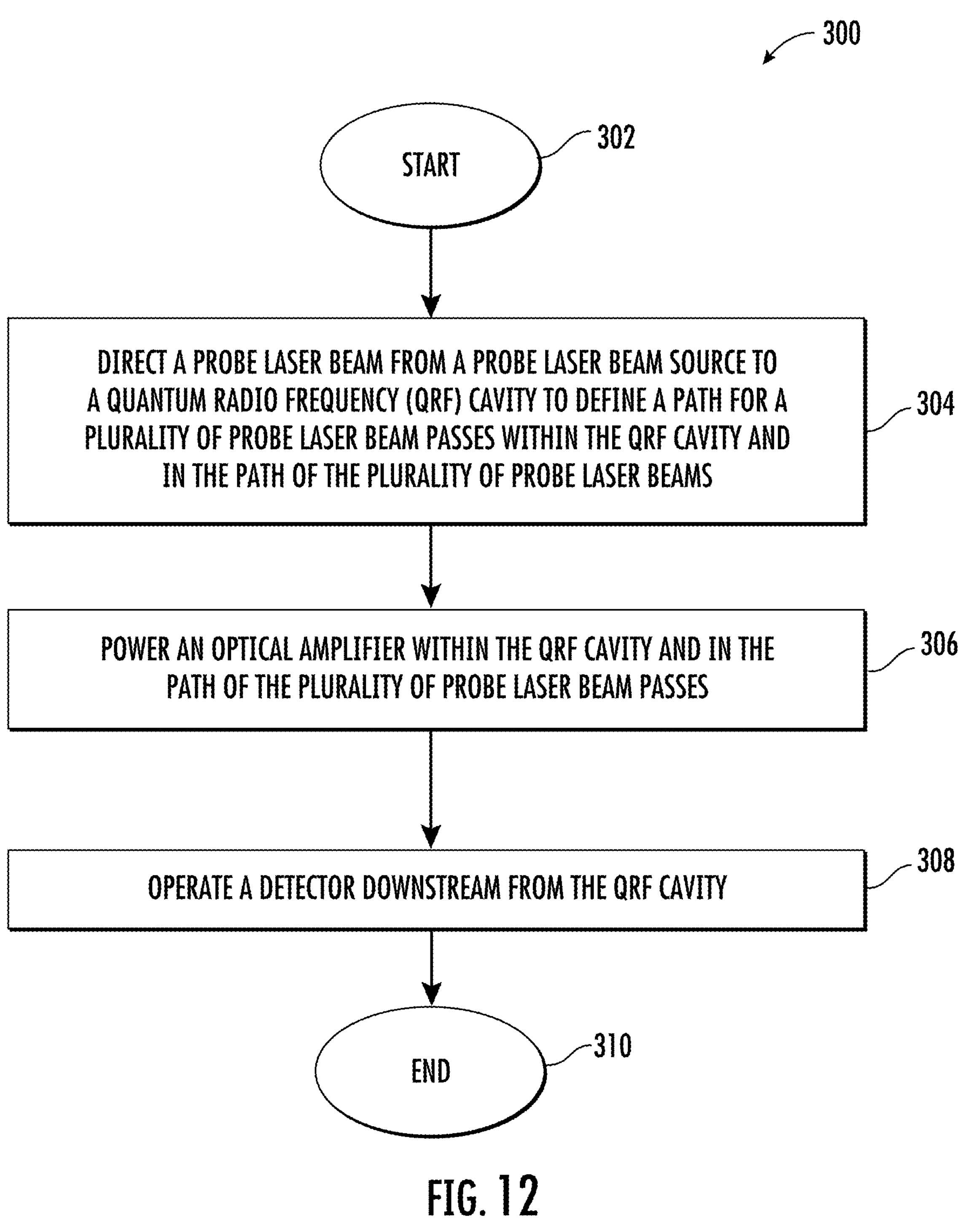
FIG. 12 is a flowchart showing a method for Rydberg sensing employing the Rydberg sensor of FIG. 8.

Referring now to FIG. 12, there is illustrated generally at 300 a flowchart showing an example for Rydberg sensing. The process starts (Block 302) and continues by directing a probe laser beam from a probe laser beam source 134' to a quantum radio frequency (QRF) cavity 145' as an optical cavity to define a path for a plurality of probe laser beam passes within the QRF cavity, with the Rydberg sensing region 122' within the QRF cavity and in the path of the plurality of probe laser beam passes (Block 304). The method includes powering an optical amplifier 127' within the QRF cavity 145' and in the path of the plurality of probe laser beam passes (Block 306). A detector 132' is operated downstream from the QRF cavity (Block 308). The process ends (Block 310).

Figure 13:
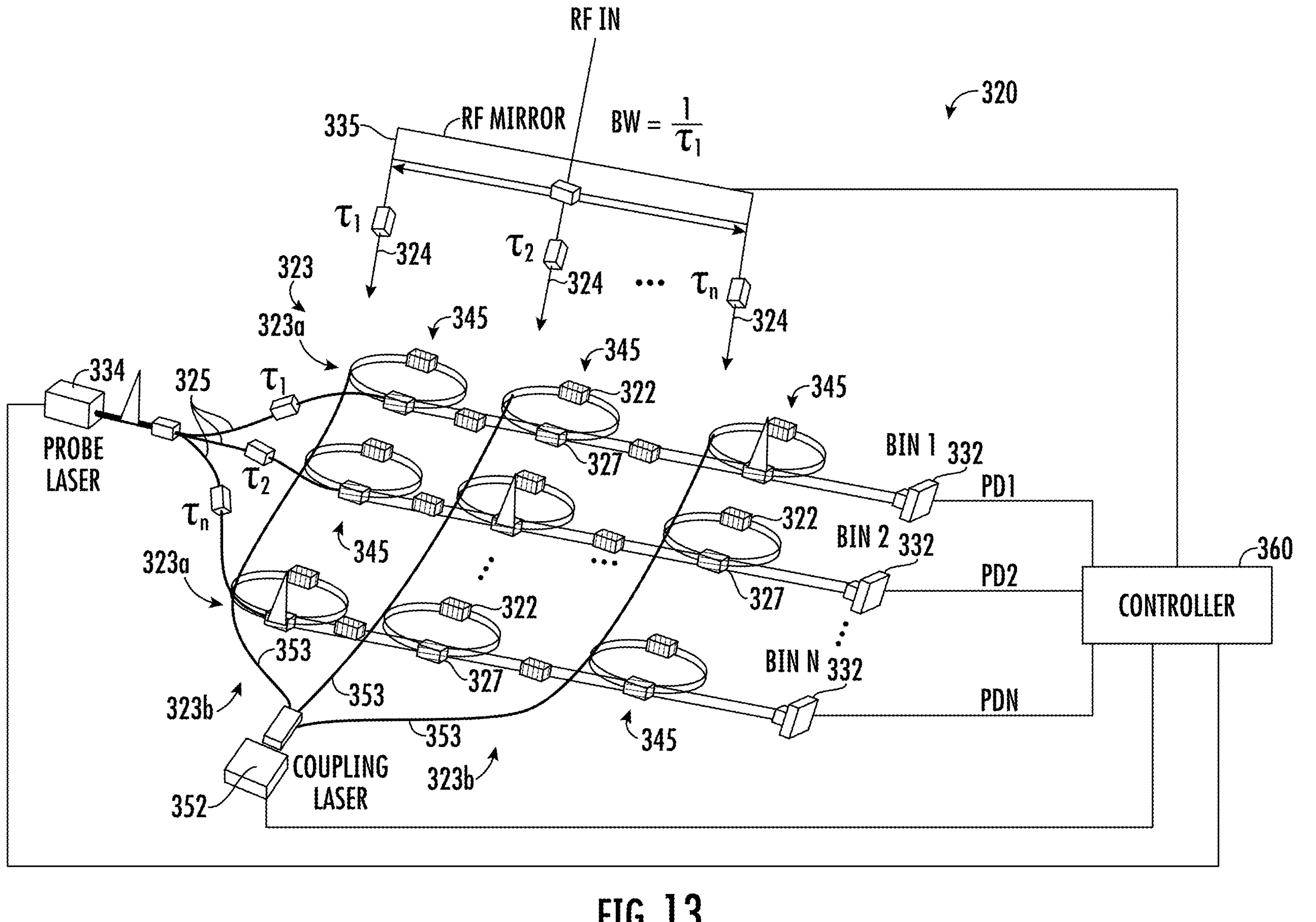
FIG. 13 is a schematic diagram of a Rydberg sensor having an array of Rydberg quantum radio frequency (QRF) cavities according to the invention.

Referring now to FIG. 13, there is illustrated the Rydberg sensor 320 where Rydberg QRF cavities 345 are spatiotemporally multiplexed to maximize the visibility of the Rydberg sensing, allowing the standard quantum limit (SQL) to be approached, and even surpassed for certain instantaneous bandwidths. For example, through spatial and temporal multiplexing of the RF signal 324 of interest and the probe laser beam 325 generated from the probe laser source 334, along with use of the Rydberg QRF cavities 345, and the gain resonant from the probe laser beam 325, the visibility of the Rydberg measurement may be maximized, allowing the standard quantum limit (SQL) to be approached, and even surpassed for certain instantaneous bandwidths. Similar components and elements as described for the Rydberg sensor 120, 120' in FIGS. 2 and 8 are given common reference numerals in the 300 series for the Rydberg sensor 320 shown in FIG. 13.

As illustrated, the Rydberg sensor 320 in FIG. 13 includes an array 323 of Rydberg quantum radio frequency (QRF) cavities 345 arranged in a plurality of rows **323*a* and columns 323*b*. A probe laser source 334 is configured to generate a plurality of time delayed probe beams 325 for respective ones of the plurality of rows 323*a* of Rydberg QRF cavities 345. An RF signal source operates with an RF mirror 335, which is configured to receive an RF signal and generate a plurality of time delayed RF signals 324 for respective ones of the plurality of columns 323*b* of Rydberg QRF cavities 345. The time delays of the time delayed probe beams 325 correspond to time delays of the time delayed RF signals 324. Opposite the probe laser source 334 are a plurality of detectors 332 formed in an example as photodetectors for the plurality of rows 323*a* of the Rydberg QRF cavities 345. A controller 360 operates the probe laser source 334, the RF signal source as the RF mirror 335 and plurality of detectors 332. A coupling laser source 352 may be configured to generate a plurality of coupling laser beams 353 for the plurality of columns 323*b* of Rydberg QRF cavities 345. The controller 360 may control the operation of the coupling laser source 352. The coupling laser source 352** is not constrained to a single laser. It is possible to use 3-laser excitation systems as well, and the coupling laser source may encompass multiple laser excitation systems, such as a 3-laser excitation system.

Each Rydberg QRF cavity 345 may include a Rydberg sensing region, such as a Rydberg cell 322 as described above, and an optical amplifier 327 associated therewith. Each Rydberg QRF cavity 345 may include an arrangement of optical elements, such as described in FIG. 8, to which reference is now made to the corresponding components numbered in FIG. 8.

For example, the arrangement of optical elements as shown in FIG. 8, which may be included within each Rydberg QRF cavity 345, may include a first mirror 147' between the coupling laser source 152' and first end of the optical amplifier 127', and a second mirror 149' between the probe laser source 134' and a second end of the optical amplifier 127'. The arrangement of optical elements may also include a first reflector 153' adjacent a first end of the Rydberg sensing region and aligned with the first mirror 147', and a second reflector 157' adjacent a second end of the Rydberg sensing region 122' and aligned with the second mirror 149'.

Referring again to the Rydberg sensor 320 of FIG. 13, each detector 332 corresponds to a separate time bin established by the delays of the time delayed probe beams 325 that also correspond to time delays of the time delayed RF signals 324 as shown with the different bins of the RF signal. The controller 360 may use digital signal processing (DSP) techniques as explained in greater detail below to process the signals from each detector 332 and obtain higher sensitivity operation at higher bandwidths.

In the Rydberg sensor 320, the RF signal to be measured is split into RF signal copies 324 and temporally delayed relative to each other, such as with an RF mirror 335, where the delay is equal to the desired bandwidth of the Rydberg sensor 320. Each copy of the RF signal 324 is directed to a unique column **323*b* of the array 323 to excite the atoms within that spatial area. The probe laser beam is also split into probe laser beam copies 325 and temporally delayed relative to each other. This time delay is equal to the desired bandwidth of the Rydberg sensor 320. The probe laser beam 325 pulse copies enter the Rydberg QRF cavities 345, each having a Rydberg cell 322 and optical amplifier 327 for gain. After circulating through a QRF cavity 345 for the integration time set by the inverse of the bandwidth, the probe laser beam 325 pulse is released into the next Rydberg QRF cavity 345 where it encounters a copy of the RF signal 324, and integrates for the same period of time, until it is released to the next QRF cavity. This process continues, allowing the visibility to increase beyond what is possible with a single pass through a Rydberg cell 322 or a single pass through a QRF cavity 345**.

The Rydberg sensor 320 allows for sampling at the desired bandwidth, but with sensitivities reflective of much longer integration times, and with much higher visibilities than otherwise achievable. Each detector 332 represents a measurement of a time bin of the RF signal 324 at the desired bandwidth. However, the measurement time is stretched to include the entire chain of Rydberg QRF cavities 345 with the Rydberg sensor 320 between the time bin 1 and the next pulse in the pulse stream, set to be approximately 1 microsecond for a Rubidium (Rb) based Rydberg sensor. With this Rydberg sensor 320 configuration, the sensitivity can be driven to the SQL limit and even surpassed for higher bandwidth applications. The Rydberg sensor 320 reduces initialization error of the atomic ensemble.

The data signals received from each detector 332 may be processed using Digital Signal Processing (DSP) techniques. As noted above, each detector 332 may be formed as a photodetector, which correlates to a particular series of time bins. For example, if there are 10 rows **323*a* of the chains of Rydberg QRF cavities 345 and they are operated at a 2 MHz data repetition rate, a 20 MHz data sampling rate can be achieved. In this non-limiting example, the first detector 332 as photodetector 1 (PD1) in the first row 323*a* could be used to read out optical signatures associated with the waveforms of the RF signals 324 in time bins TB1, TB11, TB21, TB31, etc. The second detector 332 in the second row 323*a* as photodetector 2 (PD2) could read out RF waveforms in time bins TB2, TB12, TB22, TB32, etc. By this technique, continuous sampling of the RF signal 324** is obtained.

The configuration of the QRF cavity 345 permits multiple round trips of the signal and works in conjunction with the chain of optical amplifiers 327. Measurements of optical signatures associated with the measurement of the first time bin TB1 can occur throughout TB1-TB11 on the first photodetector 332 (PD1). The exact temporal position and duration of the optical signature associated with the measurement of TB1 can vary depending on application. Once detected, the optical waveform is converted to a time varying voltage on a photodiode in the photodetector 332 and digitized.

Different time varying voltage signatures can be associated with specific RF signal 324 waveforms, for example, by calibrating the Rydberg sensor 320 to changes in RF power, frequency, or phase. Other photodiodes at other photodetectors 332 may follow a similar process, and DSP techniques can be used to stitch together the measurements from the different photodetectors into one data stream, representative of the original RF signal 324 which was measured.

The Rydberg sensor 320 as described overcomes the technical drawback of common, state-of-the-art Rydberg sensors where the theoretical predictions based on centimeter scale Rydberg cells show the possibility for realizing an additional 30 dB of sensitivity improvement. However, the measurements are made, per definition, at a one second integration time. With that type of integration time, key atomic parameters that come into play at higher bandwidths, such as the atomic state initialization efficiency, are not accounted for, and so both reported experimental and calculated theoretical sensitivities may be misleading for real world applications involving readout of radio frequency fields at data sampling rates greater than 1 MHz.

Figure 14:
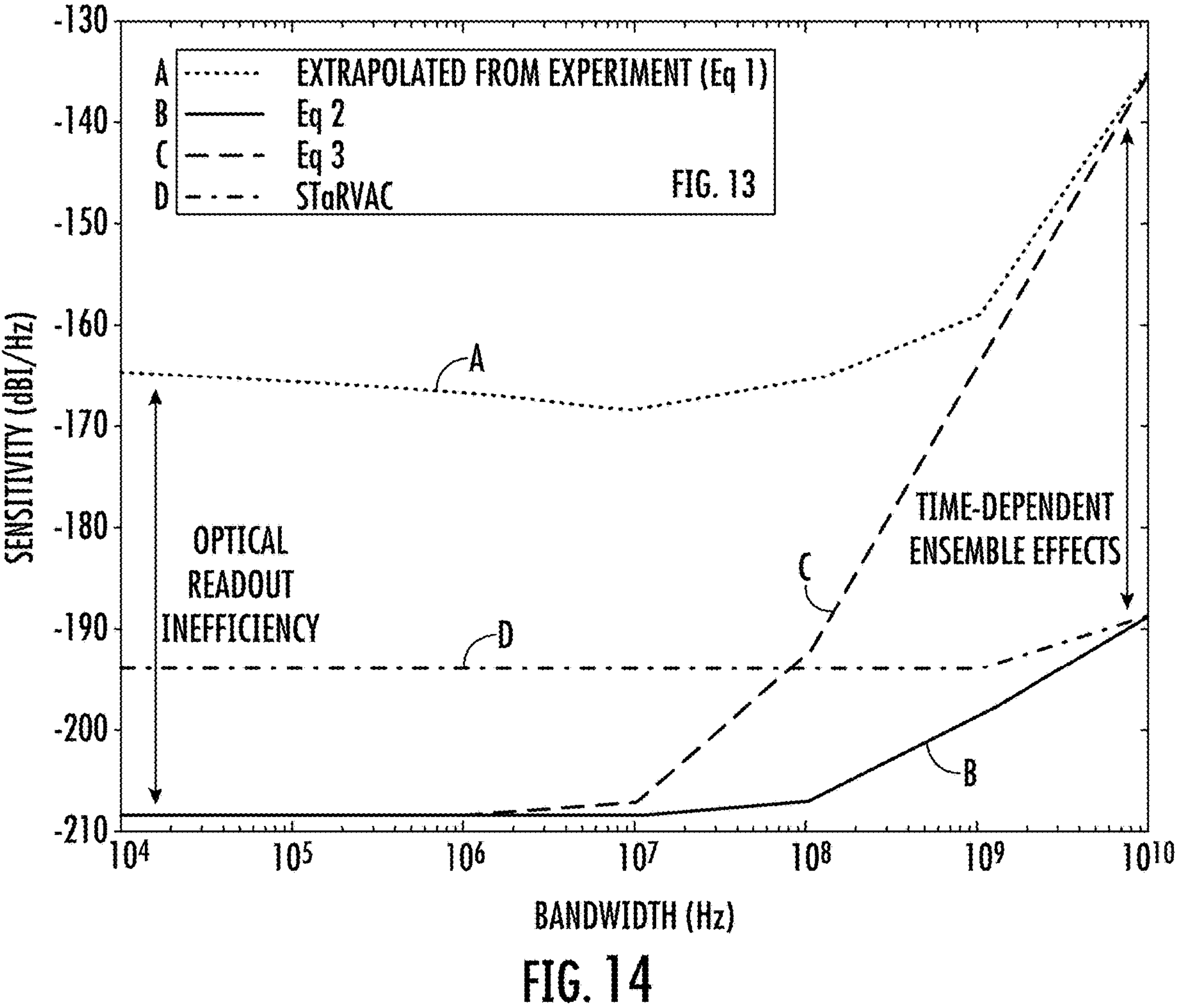
FIG. 14 is a graph showing experimental and theoretical quantum sensitivity of example Rydberg sensors as a function of instantaneous bandwidth, including the Rydberg sensor of FIG. 13.

Referring now to FIG. 14, the graph shows the discrepancy between the experimental and theoretical sensitivity for real world bandwidths. The experimental and theoretical bandwidth dependent, and independent standard quantum limited (SQL) sensitivities of quantum RF Rydberg sensors as a function of instantaneous bandwidth are illustrated with the nearly 30 dB difference in sensitivity between theory and experiment for bandwidths below 1 MHz due to the optical readout inefficiencies. Above 1 MHz, sensitivity is primarily degraded by time-dependent ensemble effects.

The Rydberg sensor 320 as shown in FIG. 13 using the array 323 of QRF cavities 345 provides a greater than 25 dB enhancement in sensitivity across all bandwidths, surpassing the bandwidth dependent SQL for bandwidths greater than 100 MHz. Reference is made to the following equations:

$$S = \exp(\chi(t)) * \frac{1}{\sqrt{t}} * \frac{\beta(T_{int})}{\gamma * C(t, T_{int}, E_{min})} \tag{1}$$

$$S_{SQL}(\beta, C=1) = \exp(\chi(t)) * \frac{1}{\sqrt{t}} * \frac{1}{\gamma} \tag{2}$$

$$S_{SQL}(\beta(T_{int}) = \exp(\chi(t)) * \frac{1}{\sqrt{t}} * \frac{\beta(T_{int})}{\gamma} \tag{3}$$

Based upon these equations, the sensitivity as a function of bandwidth is extrapolated as shown in the graphs from the experiments based on Equation 1, Equation 2, and Equation 3, where the graph lines are labeled A, B and C. The performance of the Rydberg sensor 320 of FIG. 13 is shown by the sensitivity versus bandwidth and the line labeled D. The line D also corresponds to StaRVAC, which is the acronym for Spatio-Temporal Rydberg Visibility Amplifier Chain, indicative of the array 323 of the Rydberg QRF cavities 345.

In Equation 1, Beta is the initialization parameter, which is time-dependent on the integration time as the sampling frequency and reflects on whether atoms are in a known state. That value helps indicate how well the state of the atoms in the measurement are being made. If there are a large number of measurements, an atom may not necessarily turn back to its ground state before the next measurement, since may be in a superposition state. The initialization efficiency is illustrated as Tint. The C-term corresponds to the optical readout efficiency and how the RF field from the RF signals 324 impacts an atom and how the optical field propagating through it is absorbed by the vapor or Rydberg cell 322 and how the absorption changes based on the atomic state of the atom. There is an indirect measurement. In Equation 1, C reflects that inefficiency since the absorption change is measured, rather than a direct atomic state of an atom. These two parameters reflected by Beta and C degrade performance of the system. Usually, Beta may be equal to 1 and C equal to 1. Gamma (γ) is the coupling coefficient. The graph on the horizontal axis is limited to 104 bandwidth due to computational complexity.

In Equation 2, the optical readout efficiency may be set to Beta and may correspond to the standard quantum limit (SQL). It may be misleading because it does not take into account the time dependence. Equation 3 reflects the theoretical limit. The graph for Equation 3 includes initialization errors, assuming a perfect optical readout, and thus, a more realistic quantum limit. The dashed line corresponds to the extrapolated experimental values. The line marked D is the potential sensitivity that the Rydberg sensor 320 configuration shown in FIG. 13 may provide with the array 323 of Rydberg QRF cavities 345.

The background for the three equations described above are derived from the teachings in Degen et al., "Quantum Sensing," Reviews of Modern Physics; Volume 89, No. 3; APS, July-September 2017; the disclosure which is hereby incorporated by reference in its entirety.

Figure 15:
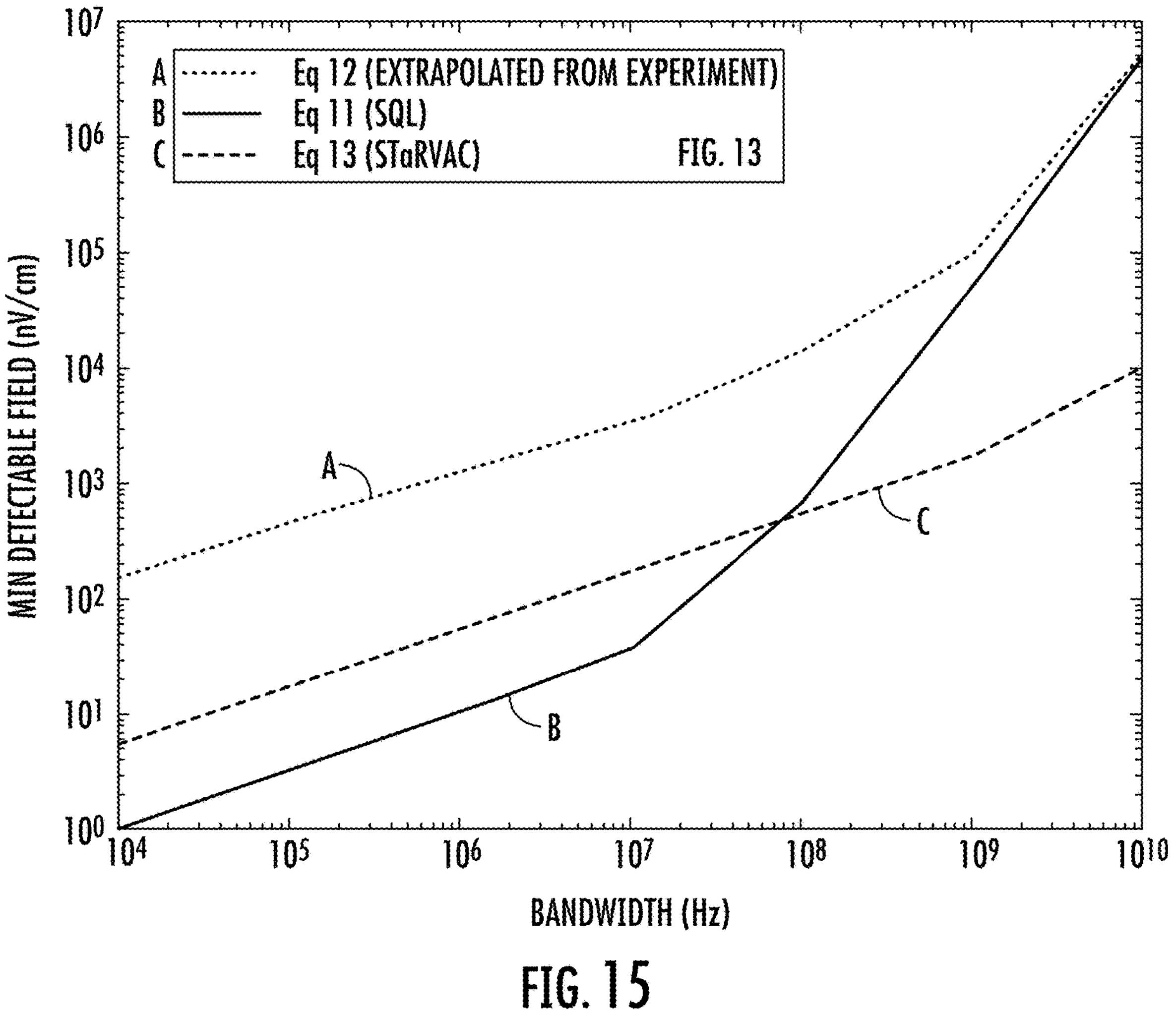
FIG. 15 is a graph showing experimental and theoretical minimum detectable electric field of example Rydberg sensors as a function of instantaneous bandwidth.

Referring now to the graph of FIG. 15, the minimum detectable electric field as a function of instantaneous bandwidth is illustrated. Reference is made to Equations 11, 12 and 13 below:

$$E_{min\,SQL(\beta(T_{int}))} = \exp(\chi(t)) * \frac{1}{\left(\frac{t}{BW}\right)^{.5}} * \frac{\beta_{SOA}(T_{int})}{\gamma} \tag{11}$$

$$E_{min\,SOA} = \exp(\chi(t)) * \frac{1}{\left(\frac{t}{BW}\right)^{.5}} * \frac{\beta_{SOA}(T_{int})}{\gamma * C_{SOA}(t, BW, E_{min})} \tag{12}$$

$$E_{min\,STaRVAC} = \exp(\chi(t)) * \frac{1}{\left(\frac{t}{BW}\right)^{.5}} * \frac{\beta_{STaRVAC}(T_{int})}{\gamma * C_{STaRVAC}(t, BW, E_{min})} \tag{13}$$

The dashed line corresponds to Equation 12 as a predicted performance extrapolated from experiment. The line for Equation 11 corresponds to the predicted performance based on the standard quantum limit (SQL). Equation 13 corresponds to the predicted performance for the Rydberg sensor 320 of FIG. 13. Due to computational difficulty, and the focus on high bandwidth, the minimum detectable field for the bandwidth is less than 10 kHz and was not calculated, but assumed to maintain the trends shown here. As evident, the Rydberg sensor 320 configuration of FIG. 13 provides the approach to the SQL within 10 dB for most bandwidths. However, the Rydberg sensor 320 surpasses the SQL for a bandwidth beyond 100 MHz.

Equation 11 represents the standard quantum limit (SQL) as the more realistic quantum limit, while Equation 12 that is extrapolated from an experiment has orders of magnitude lower than the standard quantum limit shown in Equation 11. There is a non-unity initialization error that is taken into account. The Rydberg sensor of FIG. 13 reflected by Equation 13 and its performance is better than the theoretical at lower bandwidth and knocks down the minimal detectable field from the experimental with an order of magnitude. At higher bandwidths, it surpasses the more realistic standard quantum limit because of the temporal multiplexing.

Figure 16:
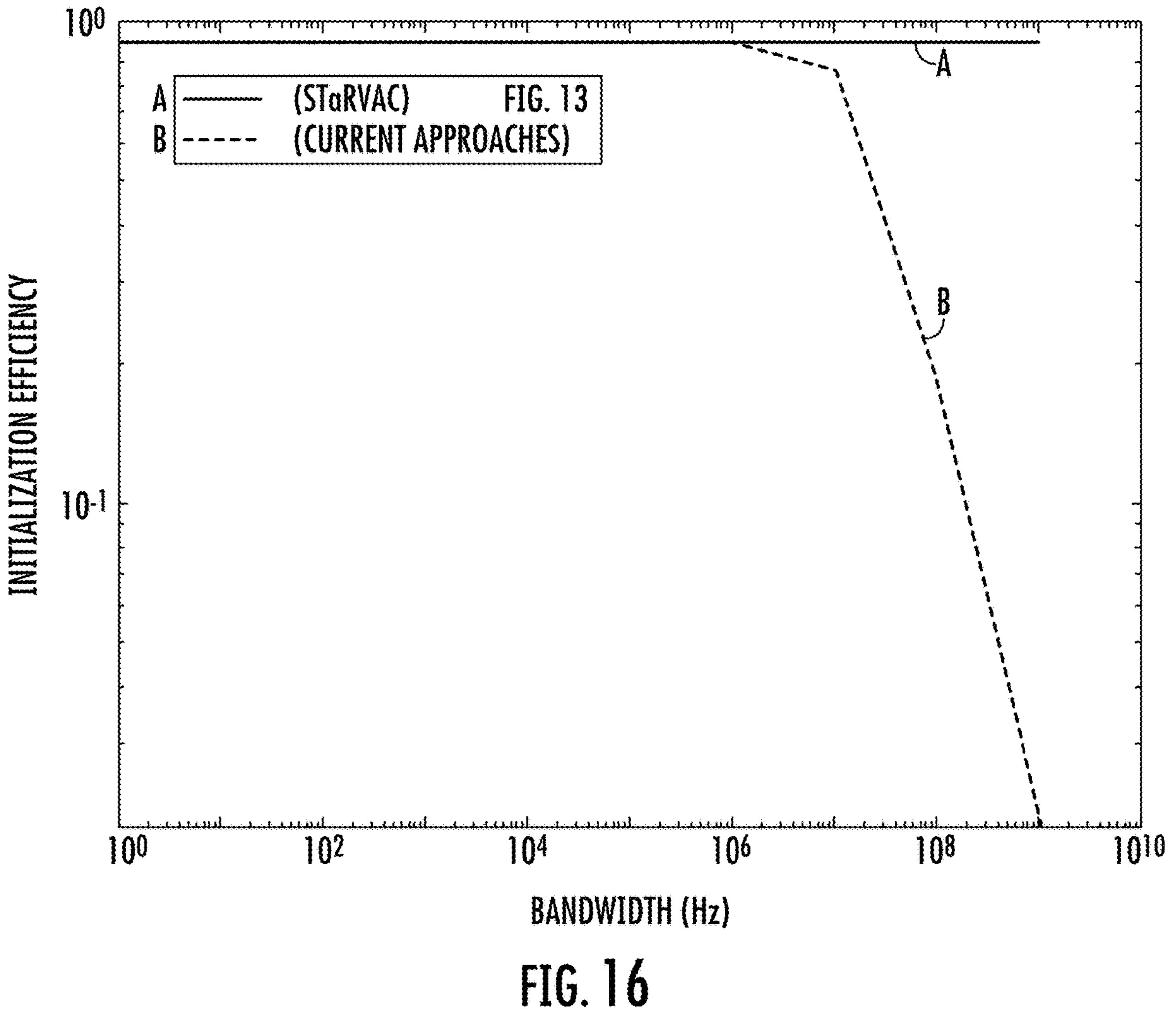
FIG. 16 is a graph of initialization efficiency as a function of bandwidth for the Rydberg sensor of FIG. 13 and state-of-the-art Rydberg sensor approaches.

Referring now to FIG. 16, the initialization efficiency as a function of bandwidth is shown in the graph. For bandwidths beyond 1 MHz, the Rydberg sensor 320 of FIG. 13 allows for the initialization efficiency parameter to remain at unity, which surpasses current approaches, and even the standard quantum limit (SQL), when time-dependent ensemble effects are accounted for. As shown by the graph, there is unity up to about 1 MHz and then begins to deflect due to the atomic relaxation times for the standard current approaches shown by the dashed line. The multiplexing with the Rydberg sensor 320 of FIG. 13 allows the system to maintain at near unity for very high bandwidths.

Figure 17:
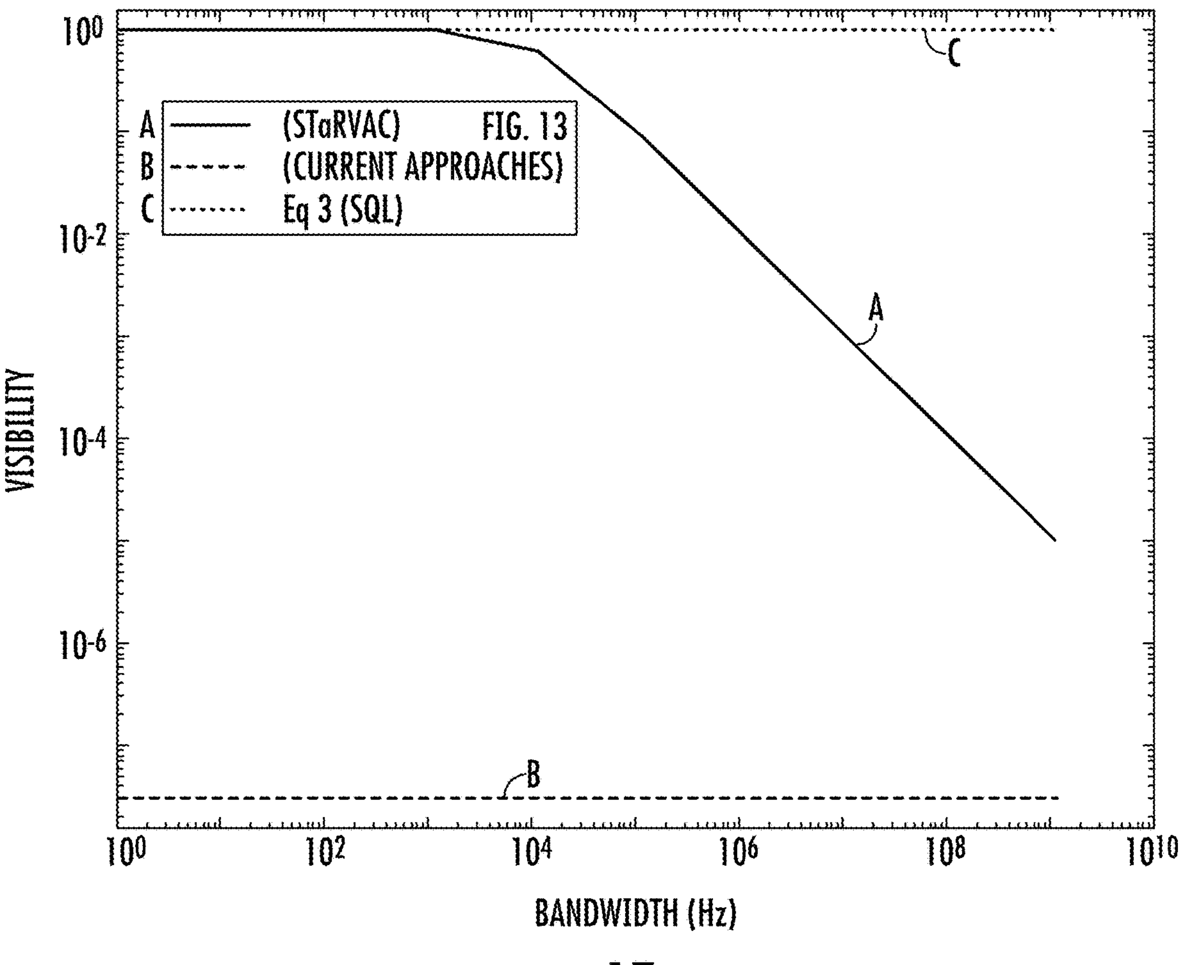
FIG. 17 is a graph showing the visibility of the optical read-out as a function of bandwidth for the Rydberg sensor of FIG. 13 and other state-of-the-art Rydberg sensors.

In the graph of FIG. 17, the visibility of the optical readout versus the bandwidth is illustrated with the Rydberg sensor 320 of FIG. 13 configuration showing much better visibility at the higher bandwidths, compared to current approaches and the standard quantum limit (SQL).

Figure 18:
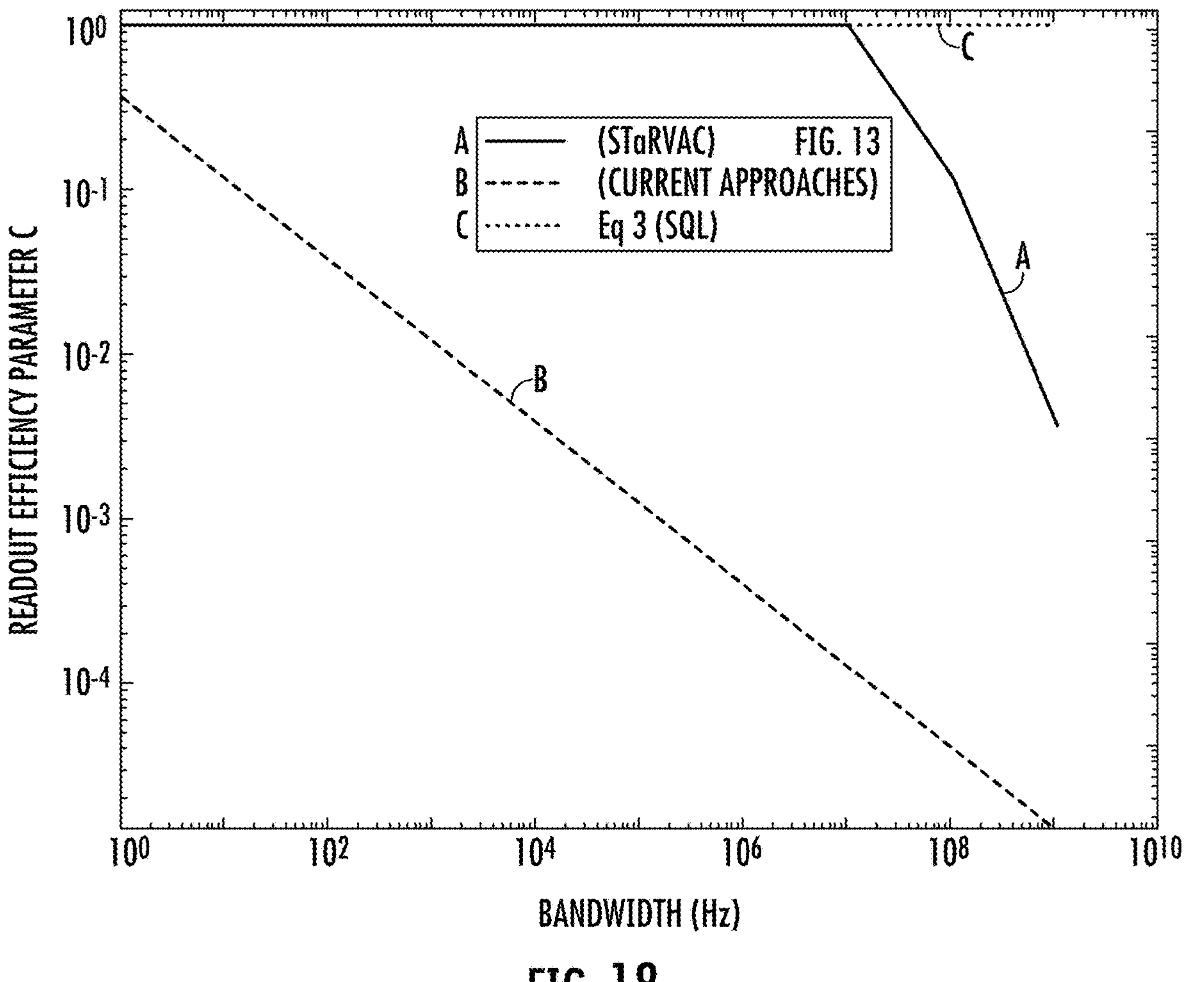
FIG. 18 is a graph showing the optical read-out efficiency as a function of bandwidth for the Rydberg sensor of FIG. 13 and other state-of-the-art Rydberg sensors.

As shown in the graph of FIG. 18, the optical readout efficiency is shown as a function of bandwidth and the configuration of the Rydberg sensor 320 in FIG. 13 maintains a near unity readout efficiency for broad bandwidths.

Figure 19:
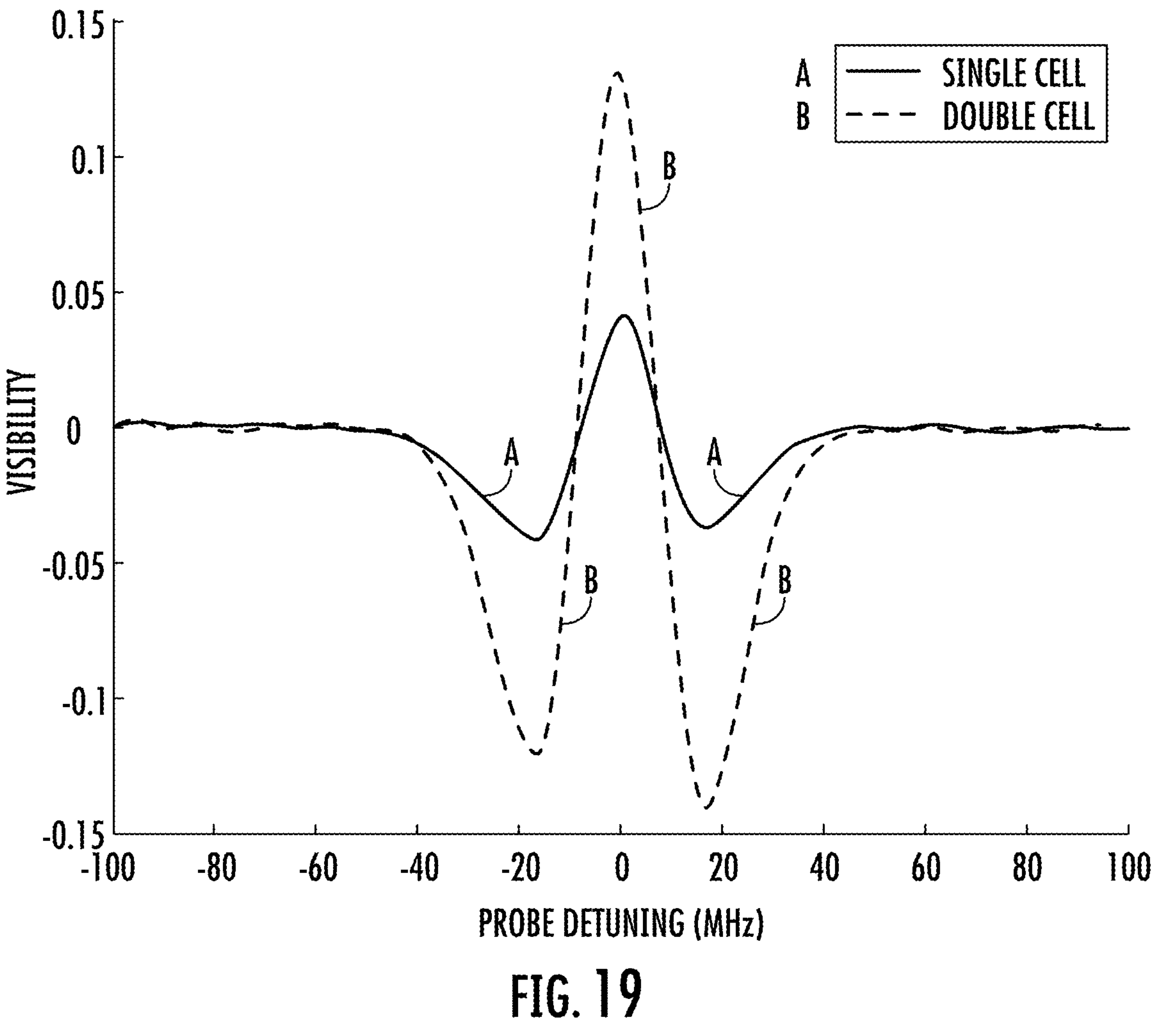
FIG. 19 is a graph showing experimental visibility for a Rydberg sensor as a function of probe detuning when an RF field is on and off for a single pass Rydberg cell and the Rydberg QRF cavity.

Referring now to the graph in FIG. 19, the experimental visibility is measured for a Rydberg vapor cell with an incident RF field on and compared to when the RF field is off. The single pass line indicative of a single pass through the Rydberg cell 322 corresponds to the state-of-the-art approach. The double pass line corresponds to the double cell or double pass and shows that passing through the Rydberg cell twice allows for the visibility to be nearly doubled, confirming proof of principle of the underlying physics involved in the Rydberg QRF cavity 345.

Figure 20:
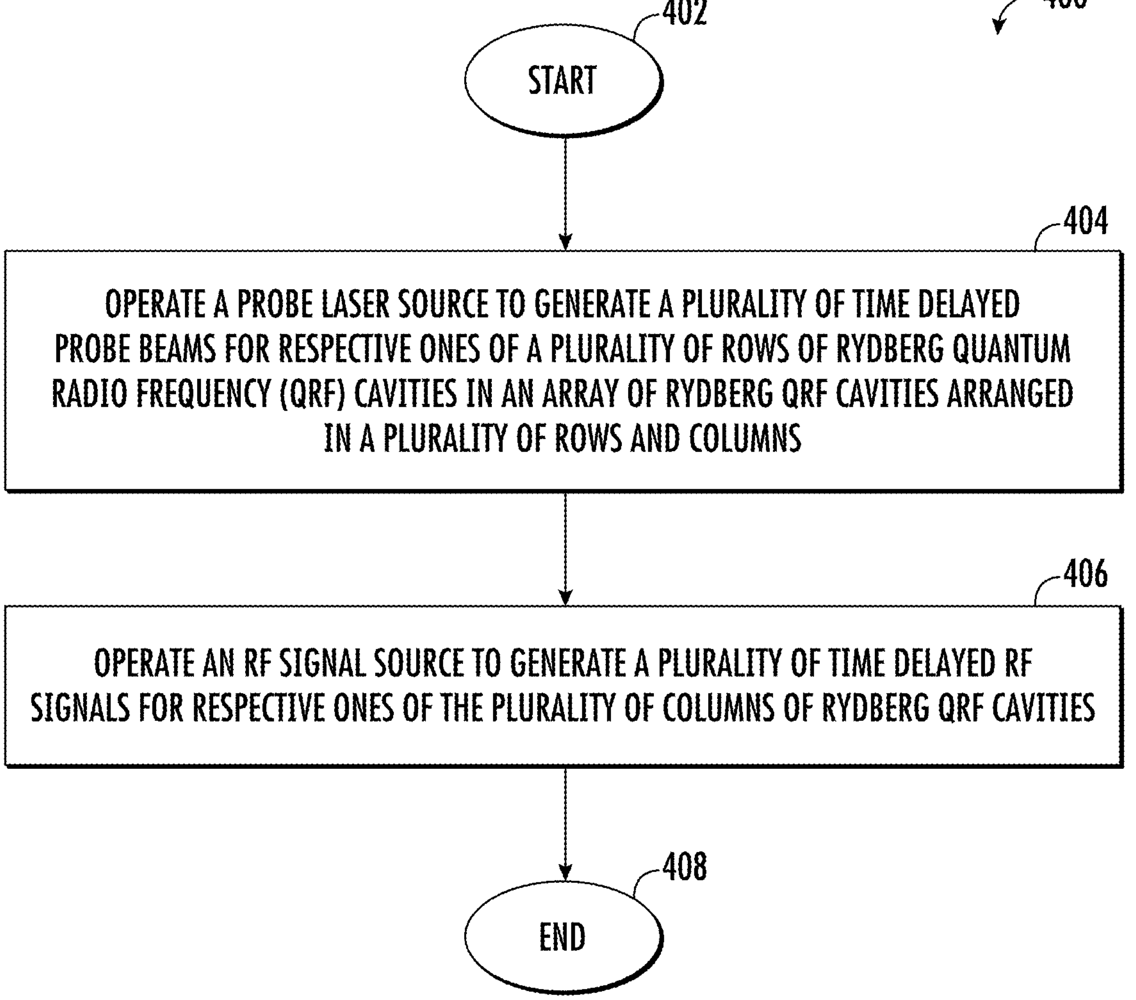
FIG. 20 is a flowchart showing a method for Rydberg sensing employing the Rydberg sensor of FIG. 13.

Referring now to FIG. 20, there is illustrated generally at 400 a high-level flowchart showing a method for Rydberg sensing. The method starts (Block 402) by operating a probe laser source 334 to generate a plurality of time delayed probe beams 325 for respective ones of a plurality of rows 323*a* of Rydberg quantum radio frequency (QRF) cavities 345 in the array of Rydberg QRF cavities arranged in a plurality of rows and columns 323*b* (Block 404). The method includes operating an RF signal source 327 to generate a plurality of time delayed RF signals 324 for respective ones of the plurality of columns 323*b* of Rydberg QRF cavities 345 (Block 406). The process ends (Block 408).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A Rydberg sensor comprising:
- an array of Rydberg quantum radio frequency (QRF) cavities arranged in a plurality of rows and columns;
- a probe laser source configured to generate a plurality of time delayed probe beams for respective ones of the plurality of rows of Rydberg QRF cavities; and
- an RF signal source configured to generate a plurality of time delayed RF signals for respective ones of the plurality of columns of Rydberg QRF cavities.

2. The Rydberg sensor of claim 1, wherein time delays of the time delayed probe beams correspond to time delays of the time delayed RF signals.

3. The Rydberg sensor of claim 1, comprising a plurality of detectors for the plurality of rows of Rydberg QRF cavities opposite the probe laser source.

4. The Rydberg sensor of claim 3, comprising a controller to operate the probe laser source, RF signal source, and the plurality of detectors.

5. The Rydberg sensor of claim 1, comprising a coupling laser source configured to generate a plurality of coupling beams for the plurality of columns of Rydberg QRF cavities.

6. The Rydberg sensor of claim 5, wherein each Rydberg QRF cavity comprises a Rydberg sensing region and an optical amplifier associated therewith.

7. The Rydberg sensor of claim 6, wherein each Rydberg QRF cavity comprises an arrangement of optical elements.

8. The Rydberg sensor of claim 7, wherein the arrangement of optical elements comprises:
- a first mirror between the coupling laser source and a first end of the optical amplifier; and
- a second mirror between the probe laser source and a second end of the optical amplifier.

9. The Rydberg sensor of claim 8, wherein the arrangement of optical elements comprises:
- a first reflector adjacent a first end of the Rydberg sensing region and aligned with the first mirror; and
- a second reflector adjacent a second end of the Rydberg sensing region and aligned with the second mirror.

10. A Rydberg sensor comprising:
- an array of Rydberg quantum radio frequency (QRF) cavities arranged in a plurality of rows and columns;
- a probe laser source configured to generate a plurality of time delayed probe beams for respective ones of the plurality of rows of Rydberg QRF cavities;
- an RF signal source configured to generate a plurality of time delayed RF signals for respective ones of the plurality of columns of Rydberg QRF cavities;
- a coupling laser source configured to generate a plurality of coupling beams for the plurality of columns of Rydberg QRF cavities; and
- a plurality of detectors for the plurality of rows of Rydberg QRF cavities opposite the probe laser source.

11. The Rydberg sensor of claim 10, wherein time delays of the time delayed probe beams correspond to time delays of the time delayed RF signals.

12. The Rydberg sensor of claim 10, comprising a controller coupled to the probe laser source, RF signal source, coupling laser source, and the plurality of detectors.

13. The Rydberg sensor of claim 10, wherein each Rydberg QRF cavity comprises a Rydberg sensing region and an optical amplifier associated therewith.

14. The Rydberg sensor of claim 10, wherein each Rydberg QRF cavity comprises an arrangement of optical elements.

15. The Rydberg sensor of claim 14, wherein the arrangement of optical elements comprises:

a first mirror between the coupling laser source and a first end of the optical amplifier; and a second mirror between the probe laser source and a second end of the optical amplifier.

16. The Rydberg sensor of claim 15, wherein the arrangement of optical elements comprises:

a first reflector adjacent a first end of the Rydberg sensing region and aligned with the first mirror; and a second reflector adjacent a second end of the Rydberg sensing region and aligned with the second mirror.

17. A method for Rydberg sensing comprising:

operating a probe laser source to generate a plurality of time delayed probe beams for respective ones of a plurality of rows of Rydberg quantum radio frequency (QRF) cavities in an array of Rydberg QRF cavities arranged in a plurality of rows and columns; and operating an RF signal source to generate a plurality of time delayed RF signals for respective ones of the plurality of columns of Rydberg QRF cavities.

18. The method of claim 17, wherein time delays of the time delayed probe beams correspond to time delays of the time delayed RF signals.

19. The method of claim 17, comprising operating a plurality of detectors for the plurality of rows of Rydberg QRF cavities opposite the probe laser source.

20. The method of claim 19, comprising operating a controller for the probe laser source, RF signal source, and the plurality of detectors.

21. The method of claim 17, comprising operating a coupling laser source to generate a plurality of coupling beams for the plurality of columns of Rydberg QRF cavities.

22. The method of claim 17, wherein each Rydberg QRF cavity comprises a Rydberg sensing region and an optical amplifier associated therewith.

* * * * *